US008869076B2

(12) United States Patent
Dmitriev et al.

(10) Patent No.: US 8,869,076 B2
(45) Date of Patent: Oct. 21, 2014

(54) GLOBAL LANDMARK METHOD FOR CRITICAL DIMENSION UNIFORMITY RECONSTRUCTION

(75) Inventors: Vladimir Dmitriev, Karmiel (IL); Ofir Sharoni, Karkur (IL)

(73) Assignee: Carl Zeiss SMS Ltd., Karmiel (IL)

( * ) Notice: Subject to any disclaimer, the term of this patent is extended or adjusted under 35 U.S.C. 154(b) by 0 days.

(21) Appl. No.: 13/878,017

(22) PCT Filed: Oct. 5, 2011

(86) PCT No.: PCT/IL2011/000779
§ 371 (c)(1),
(2), (4) Date: Jun. 24, 2013

(87) PCT Pub. No.: WO2012/046233
PCT Pub. Date: Apr. 12, 2012

(65) Prior Publication Data
US 2013/0263061 A1    Oct. 3, 2013

Related U.S. Application Data

(60) Provisional application No. 61/390,751, filed on Oct. 7, 2010.

(51) Int. Cl.
*G06F 17/50* (2006.01)
*G03F 7/20* (2006.01)

(52) U.S. Cl.
CPC ........ *G06F 17/5081* (2013.01); *G03F 7/70625* (2013.01); *G03F 7/70508* (2013.01)
USPC .................... 716/52; 716/50; 716/54; 716/56

(58) Field of Classification Search
USPC .......................................... 716/50, 52, 54, 56
See application file for complete search history.

(56) References Cited

U.S. PATENT DOCUMENTS

2005/0273308 A1*  12/2005  Houston .......................... 703/14
2008/0092088 A1*   4/2008  Nehmadi et al. .................. 716/1

OTHER PUBLICATIONS

International Search Report and Written Opinion dated May 8, 2012 for corresponding application PCT/IL2011/000779.

(Continued)

*Primary Examiner* — Vuthe Siek
*Assistant Examiner* — Magid Dimyan
(74) *Attorney, Agent, or Firm* — Fish & Richardson P.C.

(57) ABSTRACT

Data associated with a substrate can be processed by measuring a property of at least a first type of specific features and a second type of specific features on a substrate. The first type of specific features is measured at a first plurality of locations on the substrate to generate a first group of measured values, and the second type of specific features is measured at a second plurality of locations on the substrate to generate a second group of measured values, in which the first and second groups of measured values are influenced by critical dimension variations of the substrate. A combined measurement function is defined based on combining the at least first and second groups of measured values. At least one group of measured values is transformed prior to combining with another group or other groups of measured values, in which the transformation is defined by a group of coefficients. Variations in the critical dimension across the substrate are determined based on the combined measurement function and a predetermined relationship between the measured values and the critical dimension.

12 Claims, 25 Drawing Sheets

(56) References Cited

OTHER PUBLICATIONS

Gek Soon Chua et al.: "Intra Field CD Uniformity Correction by Scanner Dose Mapper™ using Galileo Mask Transmission Mapping as the CDU Data Source," Proceedings of SPIE, vol. 7640, Jan. 1, 2010, pp. 76402U-1 to 76402U-11.

Kangjoon Seo et al.: "New Critical Dimension Uniformity measurement concept based Reticle Inspection Tool," Proceedings of SPIE, vol. 7748, Jan. 1, 2010, pp. 77480N-1 to 77480N-8.

Sarychev et al "Resonance Transmittance Through a Metal Film with Subwavelength Holes" IEEE Journal of Quantum Electronics, Vol. 38, No. 7, Jul. 2002, pp. 956-963.

Garcia-Vidal et al. "Transmission of Light through a Single Rectangular Hole" Physical Review Letters 95, 103901 (2005) The American Physical Society, Week ending Sep. 2, 2005, 103901-1 to 103901-4.

\* cited by examiner

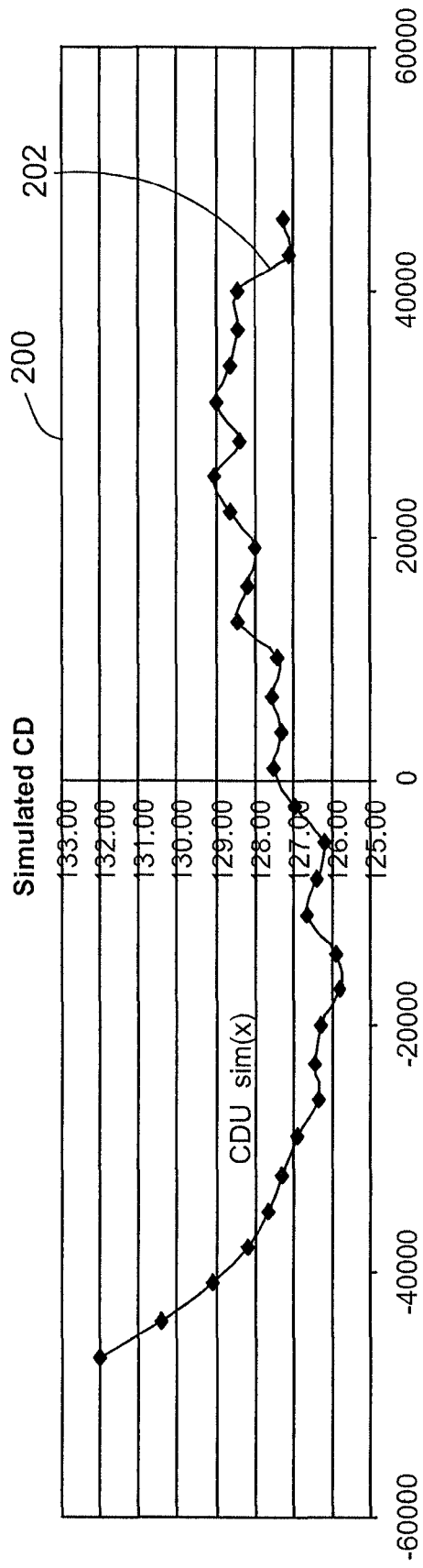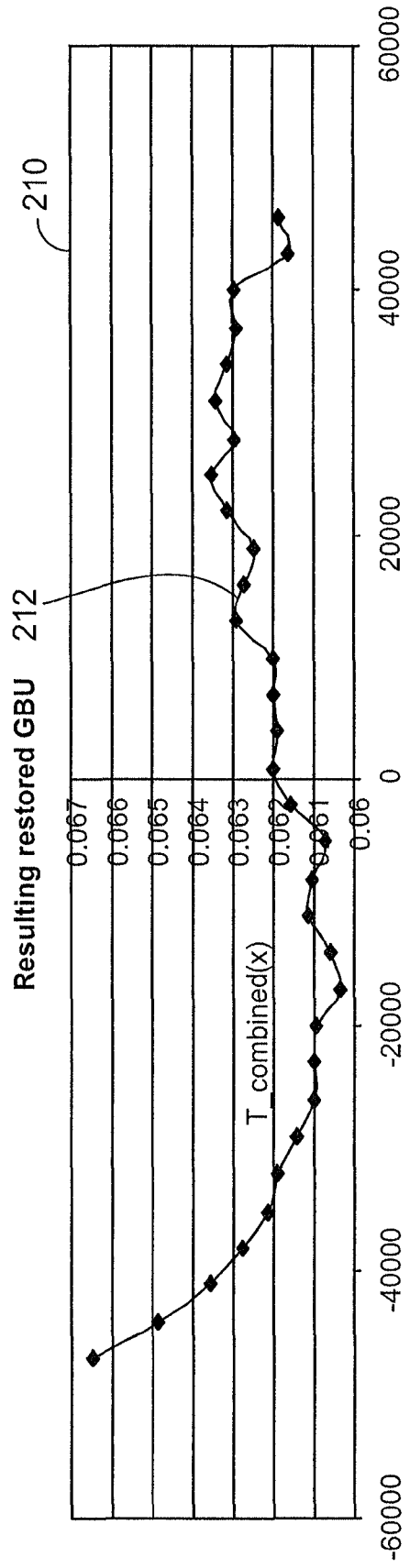

Min 58.8 nm Max 61.82nm Mean 59.96nm

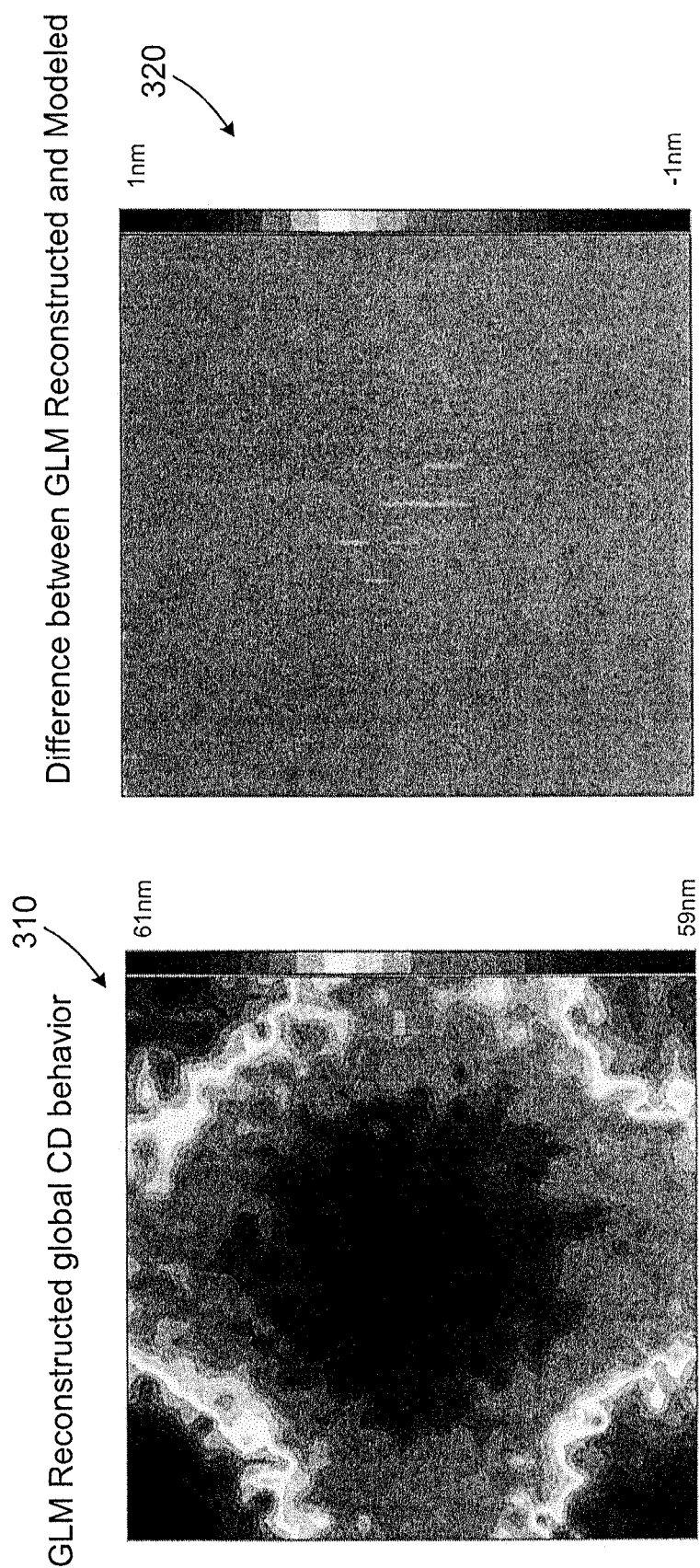

Min 58.8 nm Max 61.7nm Mean 59.93nm

Min 58.8 nm Max 61.8nm Mean 59.96nm

Measured transmittance 420

Min 6.2% Max 52% Mean 35%

Locations of the L/S and contacts transmission measurements

Black - L/S, Grey - contacts

Difference GLM Reconstructed - Modeled

Min -0.08nm  Max 0.1 sigma  0.03nm

GLM Reconstructed global CD behavior

Min 58.8 nm  Max 61.7nm  Mean 59.97nm

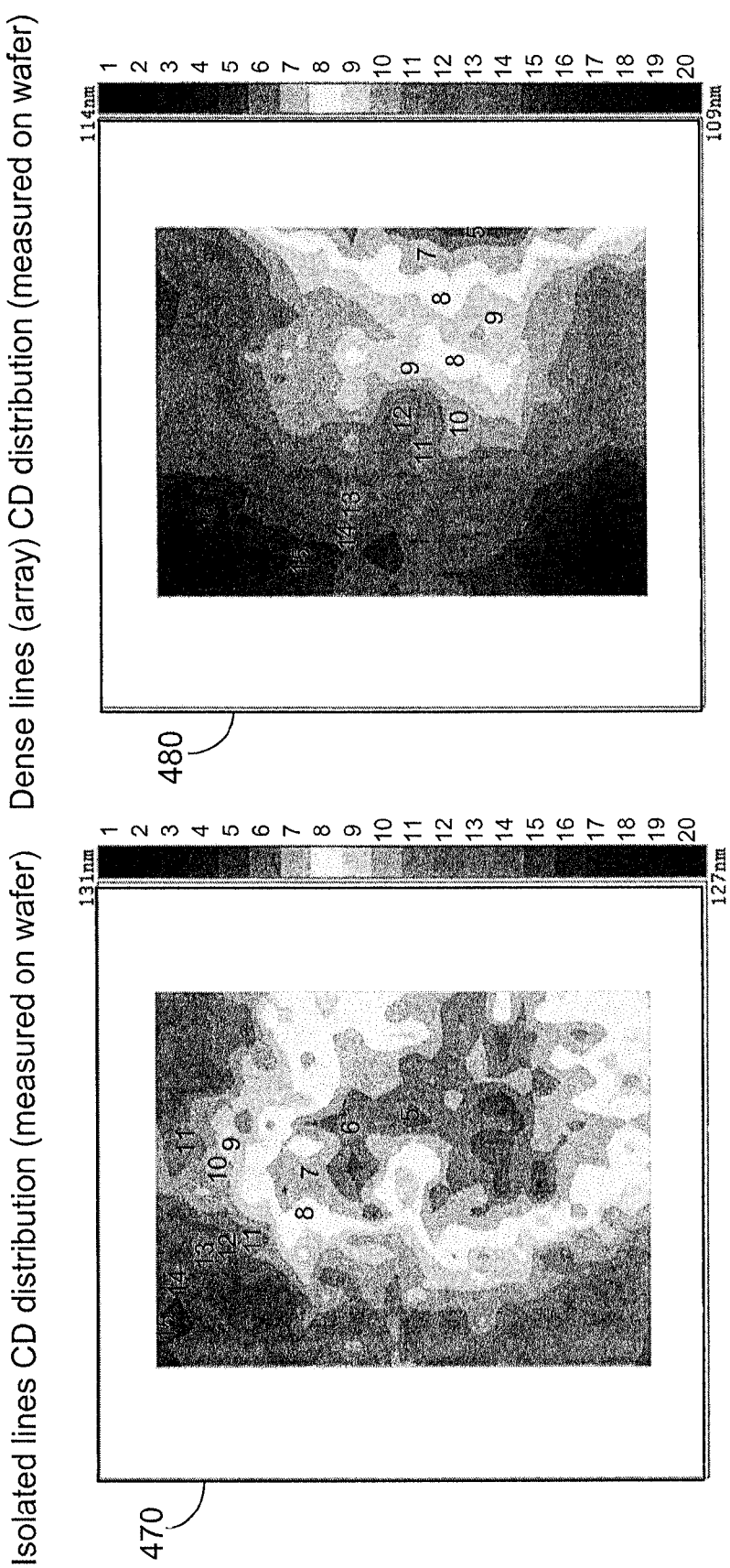

Measured behavior of Isolated Lines CD.

min = 127.9  max= 130.5  mean= 129.3  mean dev= 0.6

Restored behavior of Isolated Lines CD.

min = 127.9  max= 130.5  mean= 129.3  mean dev= 0.52

Difference of restored and measured CD behavior.

min = -0.52   max= 0.66   mean= -0.014   mean dev= 0.13

GLOBAL LANDMARK METHOD FOR CRITICAL DIMENSION UNIFORMITY RECONSTRUCTION

CROSS-REFERENCE TO RELATED APPLICATIONS

This application is a national stage application of PCT/IL2011/000779, filed on Oct. 5, 2011, which claims priority to U.S. provisional application 61/390,751, filed on Oct. 7, 2010. The above applications are incorporated by reference.

TECHNICAL FIELD

This subject matter is generally related to global landmark method for critical dimension uniformity reconstruction.

BACKGROUND

Integrated circuits can be fabricated on a semiconductor wafer using a photolithography process. As feature sizes of the integrated circuits become smaller, it is important to control the uniformity of the critical dimensions (CD) of features on the wafer. The critical dimensions refer to the dimensions of critical features on the wafer, such as minimum line width of single lines, minimum line width of densely spaced lines, and the minimum size of contact holes. The critical dimension uniformity greatly affects the yield and performance of integrated circuits produced from each wafer. The critical dimensions on the wafer can be measured using, for example, scanning electron microscopy. When non-uniformity in the critical dimensions within the image field on the wafer is detected, the photolithography system can be adjusted to reduce the non-uniformity to improve the quality of the integrated circuits fabricated on the wafer.

SUMMARY

In general, in one aspect, a method for processing data associated with a substrate is provided. The method includes measuring a property of at least a first type of specific features and a second type of specific features on a substrate, the first type of specific features being measured at a first plurality of locations on the substrate to generate a first group of measured values, the second type of specific features being measured at a second plurality of locations on the substrate to generate a second group of measured values, the first and second groups of measured values being influenced by critical dimension variations of the substrate; defining a combined measurement function based on combining the at least first and second groups of measured values, at least one group of measured values being transformed prior to combining with another group or other groups of measured values, the transformation being defined by a group of coefficients; and determining variations in the critical dimension across the substrate based on the combined measurement function and a predetermined relationship between the measured values and the critical dimension.

Implementations of the method may include one or more of the following features. The substrate can include a photomask or a semiconductor wafer. The first type of specific features can include a first type of critical features, and the second type of specific features can include a second type of critical features. The measured property can include an optical property of the substrate at the first and second plurality of locations. The measured property can include transmittance of the substrate at the first and second plurality of locations. The measured property can include reflectance of the substrate at the first and second plurality of locations. The substrate can include a photomask. The measured property can include transmittance of a specific feature or a combination of specific features on the photomask at each of the first and second plurality of locations. The measured property can include reflectance of a specific feature or a combination of specific features on the photomask at each of the first and second plurality of locations. The measured property can include scattering of ultraviolet, deep ultraviolet, or extreme ultraviolet light by the substrate at the first and second plurality of locations. The measured property can include a critical dimension of a specific feature at each of the first and second plurality of locations.

The measured property can include an electrical property (e.g., electric capacitance or electric resistance) of a specific feature at each of the first and second plurality of location. The measured property can include an aerial imaging critical dimension of a specific feature on the substrate at each of the first and second plurality of locations. The measured property can include scattering of X-ray by a specific feature on the substrate at each of the first and second plurality of locations. The method can include measuring a combination of two or more properties of the first and second types of features at the first and second plurality of locations on the substrate. The properties can include an optical property of the substrate, transmittance of the substrate, reflectance of the substrate, transmittance of a specific feature, reflectance of a specific feature, transmittance of a combination of specific features, reflectance of a combination of specific features, scattering of ultraviolet light, scattering of deep ultraviolet, scattering of extreme ultraviolet light, an electrical property of the substrate, an electric capacitance of a specific feature on the substrate, an electric resistance of a specific feature on the substrate, an aerial imaging critical dimension of a specific feature on the substrate, and/or scattering of X-ray by a specific feature on the substrate.

The predetermined relationship between the measured values and the critical dimension can include a linear relationship between variations in the measured values and variations in the critical dimension. The method can include identifying boundaries between different groups of measured or transformed measured values. The method can include determining values for the coefficient values of the transformation to enhance smoothness of the combined measurement function at the boundaries between the different groups of measured or transformed measured values. The method can include for each boundary, determining a step between measured or transformed measured values associated with two types of specific features. Determining the coefficient values of the transformation can include selecting the coefficient values to reduce a sum of squares of the steps at the boundaries. Determining the coefficient values of the transformation can include selecting the coefficient values to minimize a sum of squares of the steps at the boundaries.

The method can include for each boundary, determining a second derivative of the combined measurement function. Determining values for the coefficient values of the transformation can include selecting the coefficient values to reduce a sum of squares of the second derivatives of the combined measurement function at the boundaries. Determining values for the coefficients can include selecting the coefficient values to minimize a sum of squares of the second derivatives of the combined measurement function at the boundaries. Determining the second derivative can include using a finite difference method to determine the second derivative. The transformation can include a polynomial transformation. The transformation can include a linear transformation. The first type of specific features can include an arrangement of one or more lines, or an arrangement of one or more contact openings.

In general, in another aspect, a method for processing data associated with a photomask is provided. The method includes measuring transmittance of at least a first type of critical features and a second type of critical features on a photomask, the first type of critical features being measured at a first plurality of locations on the photomask to generate a first group of transmittance values, the second type of critical features being measured at a second plurality of locations on the photomask to generate a second group of transmittance values, the first and second groups of transmittance values being influenced by critical dimension variations of the photomask; defining a combined measurement function based on combining the at least first and second groups of transmittance values, at least one group of transmittance values being transformed prior to combining with another group or other groups of transmittance values, the transformation being defined by a group of coefficients; and determining variations in the critical dimension across the photomask based on the combined measurement function and a predetermined relationship between the transmittance values and the critical dimension.

Implementations of the method may include one or more of the following features. The predetermined relationship between the transmittance values and the critical dimension can include a linear relationship between variations in the transmittance values and variations in the critical dimension. The method can include identifying boundaries between different groups of transmittance or transformed transmittance values. The method can include determining the coefficient values of the transformation to enhance smoothness of the combined measurement function at the boundaries between the different groups of transmittance or transformed transmittance values. The method can include for each boundary, determining a step between transmittance or transformed transmittance values associated with two types of critical features. Determining the coefficient values of the transformation can include selecting the coefficient values to reduce a sum of squares of the steps at the boundaries. Determining the coefficient values of the transformation can include selecting the coefficient values to minimize a sum of squares of the steps at the boundaries. The method can include for each boundary, determining a second derivative of the combined measurement function. Determining the coefficient values of the transformation can include selecting the coefficient values to reduce a sum of squares of the second derivatives of the combined measurement function at the boundaries. Determining values for the coefficients can include selecting the coefficient values to minimize a sum of squares of the second derivatives of the combined measurement function at the boundaries. Determining the second derivative can include using a finite difference method to determine the second derivative. The transformation can include a polynomial transformation. The transformation can include a linear transformation. The first type of critical features can include an arrangement of one or more lines, or an arrangement of one or more contact openings. The method can include modifying the transmittance of the photomask at various locations to enhance the uniformity of the critical dimension across the photomask.

In general, in another aspect, a method for processing data associated with a substrate is provided. The method includes performing measurements on a plurality of groups of targets on a substrate, the plurality of groups of targets including a first type of targets and a second type of targets, the first type of targets being measured at a first group of locations on the substrate to generate a first group of measurement values, the second type of targets being measured at a second group of locations on the substrate to generate a second group of measurement values, the plurality of groups of measurement values being influenced by variations in a global parameter that is a function of location on the substrate; defining a combined measurement function representing a combination of the plurality of groups of measurement values taking into account of the locations of the measurements, at least one group of measurement values being transformed prior to combining with another group or other groups of measurement values, the transformations being defined by a set of coefficients; determining values for the coefficients of the transformation; and determining variations in the global parameter based on the combined measurement function and a predetermined relationship between the measurement values and the global parameter.

Implementations of the method may include one or more of the following features. The global parameter can include critical dimension across the substrate. The predetermined relationship between the measurement values and the global parameter can include a linear relationship between variations in the measurement values and variations in the global parameter. The method can include modifying the substrate at various locations to reduce the variation in the global parameter. Determining values for the coefficients can include selecting the coefficient values of the transformation to enhance a smoothness of curvature of the combined measurement function. Determining values for the coefficients of the transformation can include optimizing values for the coefficients to maximize a smoothness of the curvature of the combined measurement function. Maximizing the smoothness of the curvature of the combined measurement function can include minimizing squares of differences of measurement values at boundaries between different groups of measurements. Determining values for the coefficients of the transformation can include reducing overall differences between adjacent data points belonging to different groups.

The method can include identifying boundaries between different groups of targets. Determining values for the coefficients of the transformation can include determining values for the coefficients to enhance smoothness of the combined measurement function at the boundaries. The method can include for each boundary, determining a step between values of the combined measurement function at data points that are adjacent to and on different sides of the boundary. Determining values for the coefficients of the transformation can include selecting the coefficient values to reduce a sum of squares of the steps at the boundaries. Determining values for the coefficients of the transformation can include selecting the coefficient values to minimize a sum of squares of the steps at the boundaries.

The method can include for each boundary, determining a second derivative of the combined measurement function. Determining values for the coefficients of the transformation can include selecting the coefficient values to reduce a sum of squares of the second derivatives of the combined measurement function at the boundaries. Determining values for the coefficients can include selecting the coefficient values to minimize a sum of squares of the second derivatives of the combined measurement function at the boundaries. Determining the second derivative can include using a finite difference method to determine the second derivative.

Using a finite difference method to determine the second derivative can include using a first finite difference formula to determine the second derivative at a first boundary where the first type of target is located relative to the second type of target in a +x direction, and using a second finite difference formula to determine the second derivative at a second boundary where the first type of target is located relative to the second type of target in a −x direction. Using a finite difference method to determine the second derivative can include using a first finite difference formula to determine the second derivative at a first boundary where the first type of target is located relative to the second type of target in a +y direction, and using a second finite difference formula to determine the second derivative at a second boundary where the first type of target is located relative to the second type of target in a −y direction. Using a finite difference method to determine the second derivative comprises using a first finite difference formula to determine the second derivative at a first boundary where the first type of target is located relative to the second type of target in +x and +y directions, and using a second finite difference formula to determine the second derivative at a second boundary where the first type of target is located relative to the second type of target in −x and +y directions. Using a finite difference method to determine the second derivative can include using a first finite difference formula to determine the second derivative at a first boundary where the first type of target is located relative to the second type of target in +x and +y directions, and using a second finite difference formula to determine the second derivative at a second boundary where the first type of target is located relative to the second type of target in +x and −y directions.

Determining values for the coefficients can include selecting the coefficient values to reduce overall steps of the combined measurement function at boundaries between measurement values associated with different groups of targets. Performing the measurements on the first type of targets can include measuring transmission of the substrate at the first group of locations with respect to a radiation, and performing the measurements on the second type of targets can include measuring transmission of the substrate at the second group of locations. The transformation can include a linear transformation. The substrate can include a photomask or a wafer. The first type of targets can include a first type of critical features, and the second type of target can include a second type of critical features. The first type of critical features can include at least one of an isolated line, an arrangement of lines, an isolated contact opening, or an arrangement of contact openings. The measurements on the first and second types of targets can include critical dimension measurements. The global parameter can have one dimension, and the measurements can be performed in a one-dimensional space. The global parameter can have two dimensions, and the measurements can be performed in a two-dimensional space. The global parameter can have N dimensions, and the measurements can be performed in an N-dimensional space, N being an integer greater than 2.

In general, in another aspect, a method of measuring a global parameter based on indirect measurements is provided. The method includes performing groups of indirect measurements of an N-dimensional global parameter at various positions in an N-dimensional space, N being a positive integer, to generate a plurality of indirect measurement values, the indirect measurement values being influenced by variations of the global parameter; defining a target function that depends on a combination of one or more groups of indirect measurement values and one or more groups of transformed indirect measurement values, taking into account of the positions of the indirect measurements in the N-dimensional space, each of the one or more transformations being defined by a set of coefficients; optimizing the target function by optimizing coefficient values of the transformations; and determining variations in the global parameter based on the target function and a predetermined relationship between the indirect measurement values and the global parameter.

Implementations of the method may include one or more of the following features. The predetermined relationship between the indirect measurement values and the global parameter can include a linear relationship between variations in the indirect measurement values and variations in the global parameter. Optimizing the target function can include stitching the indirect measurement values and transformed indirect measurement values in a way to reduce steps between the indirect measurement values or transformed indirect measurement values of different groups. Optimizing the target function can include stitching indirect measurement values or transformed indirect measurement values in a way to minimize steps between the indirect measurement values or transformed indirect measurement values of different groups. The indirect measurement values within a group can be associated with a same transformation, and the indirect measurement values for different groups can be associated with different transformations. Optimizing the target function can include stitching indirect measurement values or transformed indirect measurement values in a way to increase smoothness in transition between the indirect measurement values or transformed indirect measurement values of different groups. Optimizing the target function can include stitching indirect measurement values or transformed indirect measurement values in a way to maximize smoothness in transition between the indirect measurement values or transformed indirect measurement values of different groups.

The method can include determining coefficients of the transformation or transformations to enhance a smoothness of curvature of the target function near boundaries between different groups of indirect measurement values or transformed indirect measurement values. The method can include determining coefficients of the transformation or transformations to maximize a smoothness of curvature of the combined measurement function near boundaries between different groups of indirect measurement values. The method can include modifying a work piece associated with the global parameter to modify the global parameter. Modifying the work piece can include modifying the work piece to reduce variations in the global parameter. The work piece can include a photomask and the global parameter can include critical dimension. The indirect measurements can include measurements of transmissions of a radiation through the photomask.

In general, in another aspect, a method of determining a distribution of a parameter based on measurements of two or more types of measurands is provided. The method includes performing measurements on at least two types of measurands at a plurality of spatial locations, the measurands being influenced by variations of a parameter; dividing the measurements into groups according to dependency on the variations of the parameter; applying at least one transformation defined by a group of coefficients to at least one group of measurements to generate transformed measurements; defining a combined measurement function that represents the measurements that have not been transformed and the transformed measurements as a function of spatial location; selecting the coefficients according to a predetermined criteria; and determining a distribution of variations of the parameter based on the combined measurement function and a predetermined relationship between the measurands and the parameter.

Implementations of the method may include one or more of the following features. The predetermined relationship between the measurands and the parameter can include a linear relationship between variations of the measurands and variations of the parameter. The slope of the linear relationship can be different for different groups of measurands. Selecting the coefficients according to a predetermined criteria can include selecting the coefficients to enhance a smoothness of curvature of the combined measurement function. Selecting the coefficients according to a predetermined criteria can include selecting the coefficients to maximize a smoothness of curvature of the combined measurement function. The parameter can include a critical dimension on a substrate and the measurands can include transmittance at two types of critical features on the substrate. Applying a transformation to a group of measurements can include applying a linear transformation to the group of measurements.

DESCRIPTION OF DRAWINGS

FIG. 7A is a graph showing example simulated critical dimension variations.

FIG. 7B is a graph showing an example combined measurement function that is determined based on two sets of transmittance measurements.

FIG. 14 is a graph showing an example critical dimension uniformity map that is reconstructed based on two groups of measurements.

FIG. 15 is a graph showing the difference between a reconstructed critical dimension distribution and a simulated global critical dimension distribution.

FIG. 31 is a graph showing an example critical dimension distribution of isolated lines measured on a wafer.

FIG. 32 is a graph showing an example critical dimension distribution of dense lines measured on a wafer.

DETAILED DESCRIPTION

A system and method for determining variations of a global parameter based on groups of indirect measurements of the global parameter (or groups of measurements that are influenced by the same underlying global parameter) at various landmarks are provided. For example, the global parameter can be the critical dimension uniformity on a photo mask. In some implementations, there is a correlation between variation in the transmittance of the photo mask and variation in the critical dimension, so measurements of the transmittance at various landmarks can be used as indirect measurements of the critical dimension uniformity. The landmarks can be locations on the mask that have patterns or features, preferably critical features. There may be two or more types of landmarks, e.g., critical features, on the photo mask. For each type of landmark, there may be several landmarks distributed across the mask, and a group of transmittance measurements are performed at the various landmarks of the same type.

For different types of critical features, the average transmittance values may be different, and the dependency of the variations in the transmittance on the variations in the critical dimension may also be different. We assume that the global critical dimension variation affects the behavior of all the pattern-dependent critical dimensions, and that the transmittance measurements at different types of landmarks are affected by the same underlying global critical dimension variation.

Transformations are applied to some (or all) of the groups of transmittance measurements, and the transmittance values are combined (or "stitched") together into a combined group of transmittance values. For example, some of the transformations can be polynomial transformations defined by a group of coefficients. A combined measurement function is defined based on the transmittance values (some of which have been transformed). A target function is defined according to the combined measurement function, and the coefficients of the polynomial transformations are selected to optimize the target function, such as having a maximum smoothness or smallest curvature. Once the coefficients are determined, the combined measurement function can be determined, and the critical dimension distribution can be determined based on the combined measurement function. If the critical dimension variation is greater than a quality threshold, the photo mask can be corrected to improve the critical dimension uniformity.

Figure 1:
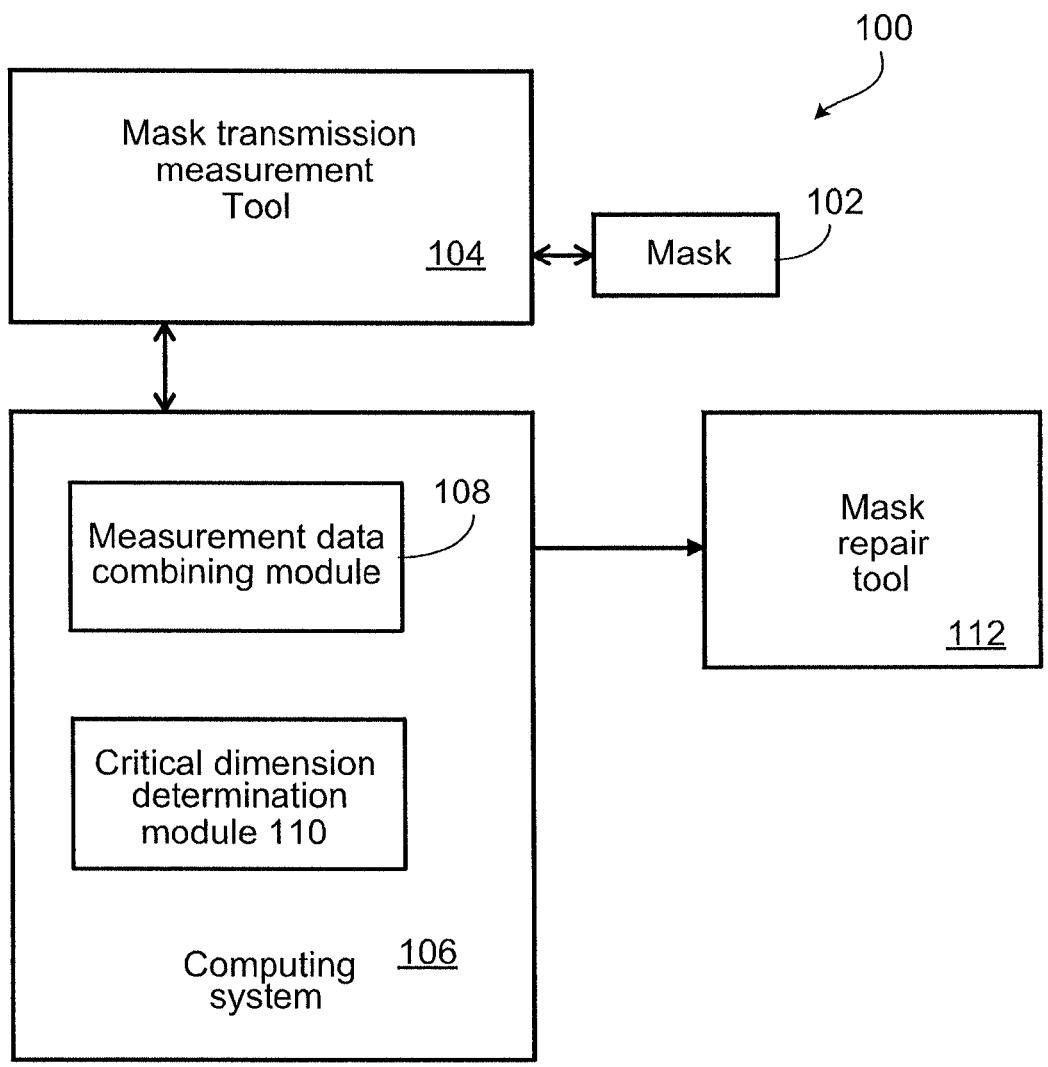
FIG. 1 is a diagram of an example system for determining the critical dimension uniformity of a photo mask.

Referring to FIG. 1, a system 100 determines critical dimension uniformity of a photo mask 102 based on transmittance measurements of the photo mask 102. The system 100 includes a mask transmittance measurement tool 104 for measuring transmittance at landmarks (e.g., critical features) distributed across the photo mask 102. The transmittance measurement tool 104 identifies the types of landmarks on the mask 102, and performs a group of transmittance measurements for each type of landmark. For example, when there are N types of landmarks (N being a positive integer), the transmittance measurement tool 104 produces N groups of transmittance measurement values.

For a perfect photo mask, the transmittance values at all measurement points corresponding to the same type of critical features are the same. However, due to critical dimension variation, defects or haze in the photo mask or other factors, such as defects in the pellicle protecting the photo mask or impurities attached to the surfaces of the photo mask and the pellicle, the transmittance values may vary from one measurement point to another, even for the same type of critical features. For each type of feature on the mask, the specific critical dimension behavior can be a function of the writing tool drift, temperature distribution, etc. The global factors do not have large and fast variations, and most of them have smooth behaviors, so the transmittance measurements should also have a smooth behavior. Although there may be some noise when generating the patterns and measuring the transmission, the noise has low coherence and has zero mean value.

To accurately measure the global critical dimension uniformity, it is useful to measure the dimension of the same type of feature (e.g., critical feature) at many locations over the entire photo mask. However, important features may not be evenly distributed across the mask, or may only be placed in a few locations. Transmittance measurement tool may have a spot size that is sufficiently large to reduce noise and be less sensitive to positional errors. When a wide spot sampling tool is used, it may be difficult to find enough locations having only the feature sought to be measured within the spot (so that other features do not interfere with the measurements) to provide accurate information on global critical dimension. Thus, it is beneficial to use the transmittance measurements from several types of features to increase the sampling locations in determining the global critical dimension uniformity.

In this description, the use of combining several groups of indirect measurements of a parameter in order to determine the variation of the global parameter will be referred to as the "landmark method." The landmark method is designed to allow the use of several different sets of locations having different types of landmarks, in which the information gathered from all the different sets of landmarks are combined and used for reconstructing the global critical dimension uniformity.

As shown in FIG. 1, a computing system 106 determines the critical dimension uniformity of the photo mask ($\Delta CD_{mask}$) based on transmission values provided by the mask transmission measurement tool 102. The computing system 106 includes a measurement data combining module 108 that combines various groups of transmission values provided by the mask transmission measurement tool 104. We use a first order approximation and assume that for every critical feature that is measured, the variation of transmittance is proportional to the variation of critical dimension, as expressed in the following equation:

$$T_i(x,y) = T_i^0 + T_i^s * dCD(x,y) \qquad \text{(Equation 1)}$$

Here, Ti(x,y) represents the transmission value at an i-th type landmark located at position (x,y), dCD(x,y) represents the critical dimension variation at position (x,y), $T_i^0$ is a constant that represents bias, and $T_i^s$ is a constant that represents slope, scaling factor, or sensitivity factor. The equation above assumes that every set of landmarks represents the same critical dimension variation, but with different scaling. The goal is to reconstruct the critical dimension distribution CD(x,y) by analysis of all the measurements at the landmark sets.

Reconstruction of the global critical dimension uniformity using Equation 1 may require defining all the parameters $T_i^0$ and $T_i^s$ given groups of the transmission values $T_i(x,y)$. One may compute these parameters based on information about various parameters of the lithography system, such as the designs of the mask patterns, the measurement tool illumination, and the integration properties. There is a simpler way to derive the parameters from measured data. We assume that the best set of parameters gives the smoothest reconstructed global critical dimension uniformity function. In other words, stitching of the landmark patches (i.e., transmission values at the landmarks) does not contribute to natural measurement noise.

By using information on the locations of the landmarks we can construct a combined measurement function that represents the relationship between transmission values and the measurement locations. A target function can be defined that represents the square measure of the curvature of the combined measurement function. Minimization of the target function may provide a good set of transmittance parameters $T_i^0$ and $T_i^s$.

The finite element representation of the second derivative (curvature) of the combined measurement function is linear versus function values (and hence linear with respect to the transmittance parameters). We can define the target function as square form that allows optimization in a finite number of steps. The reconstructed set of $T_i^0$ and $T_i^s$ are called global landmark parameters. Landmarks with normalized measurements are called global landmarks. Here, we have two redundant parameters because smoothing conditions cannot define overall bias $T^0$ and sensitivity factor $T^s$. The redundancy can be excluded in two ways: (1) By removing the parameters for most important feature from optimization, or (2) by adding conditions on the overall bias and sensitivity factor.

We assume that the transmission values within a group have small variations relative to an average value (or bias), and different groups may have different average values (or biases). The measurement data combining module 108 combines different groups of measurement data by applying polynomial transformations to some (or all) of the groups of transmittance values to achieve relatively smooth transitions between the transmittance values from different groups.

For example, suppose there are two types of landmarks (contacts and line/spaces). Assume that the landmarks are located in one-dimensional space. The global behavior of critical dimension is simulated, in which the critical dimension has a polynomial form and includes noise. The possible variations of the transmittance of contacts and line/spaces are simulated, resulting in two independent series of the simulated measurements ($T_{ls}(x)$ representing transmittance values for line/spaces and $T_c(x)$ representing transmittance values for contacts) that resemble each other because they have the same source of variations, though they vary in scale and have different mean values.

In order to construct a single curve out of the two series of simulated measurements $T_{ls}(x)$ and $T_c(x)$, a linear transformation is applied to $T_{ls}(x)$ using the formula below:

$$T'_{ls}(x) = a * T_{ls}(x) + b \quad \text{(Equation 2)}$$

where $T'_{ls}(x)$ are the transformed measurement values, and a and b are coefficients. A combined measurement function is defined to represent the simulated measurements $T_c(x)$ and $T'_{ls}(x)$. The values of a and b are selected to maximize the smoothness of the curve represented by the combined measurement function.

The computing system 106 includes a critical dimension determining module 110 determines the critical dimension distribution $\Delta CD_{mask}$ based on the combined measurement function and Equation 1. Information about $\Delta CD_{mask}$ can be provided to, for example, a mask repair tool 112 for repairing a mask to improve the critical dimension uniformity of the mask.

Figure 2B:
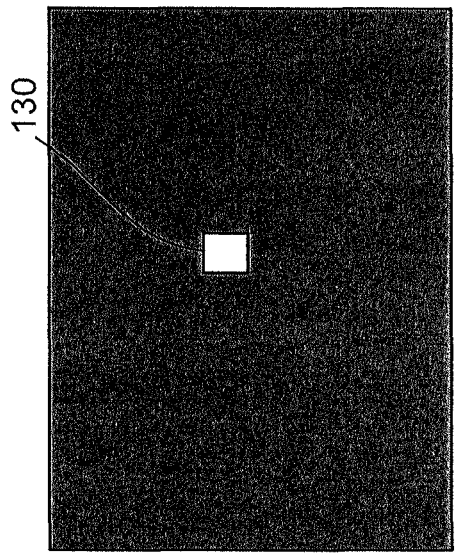
FIGS. 2A to 2D are diagrams of example critical features.
Figure 2D:
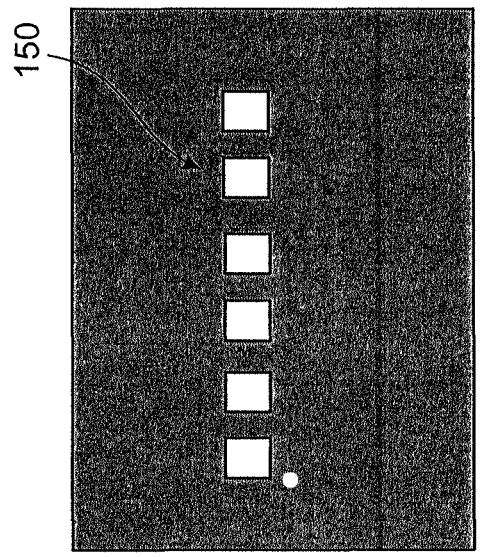
Figure 2A:
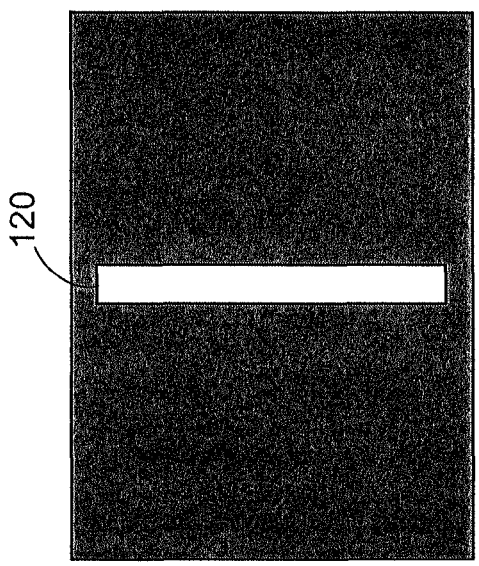
Figure 2C:
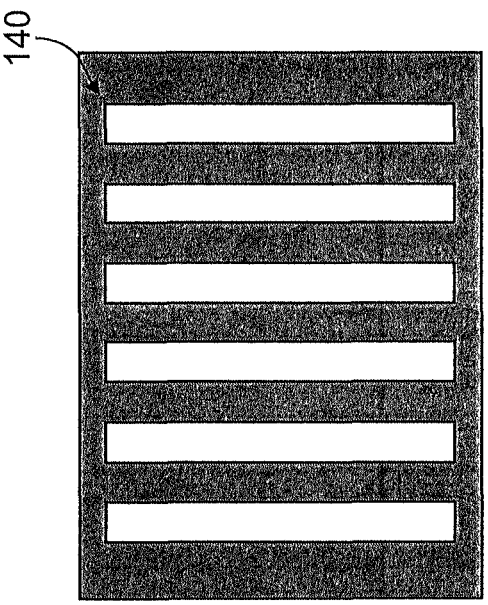

Referring to FIGS. 2A to 2D, many types of critical features can be used. For example, in a dark field mask, each critical feature can include an isolated line opening 120 (FIG. 2A), an isolated contact opening 130 (FIG. 2B), an arrangement of line openings 140 (FIG. 2C), or an arrangement of contact openings 150 (FIG. 2D). In FIG. 2C, the arrangement of line openings 140 is shown as an array of parallel line openings. In FIG. 2D, the arrangement of contact openings 150 is shown as a chain of contact openings. Other arrangements of line openings or contact openings can also be used. Different types of critical features can have different line widths or contact sizes.

The transmittance at different critical features may be different. For example, the transmittance at the line opening 120 in FIG. 2A is higher than the transmittance of the contact opening 130 in FIG. 2B because the line opening 120 allows more light to be transmitted than the contact opening 130. Similarly, the transmittance at the array of line openings 140 in FIG. 2C is higher than the transmittance of the chain of contact openings 150 in FIG. 2D.

For different critical features, the average transmittance values will be different, and the dependency of the variations in the transmittance on the variations in the critical dimension will be different.

Figure 3:
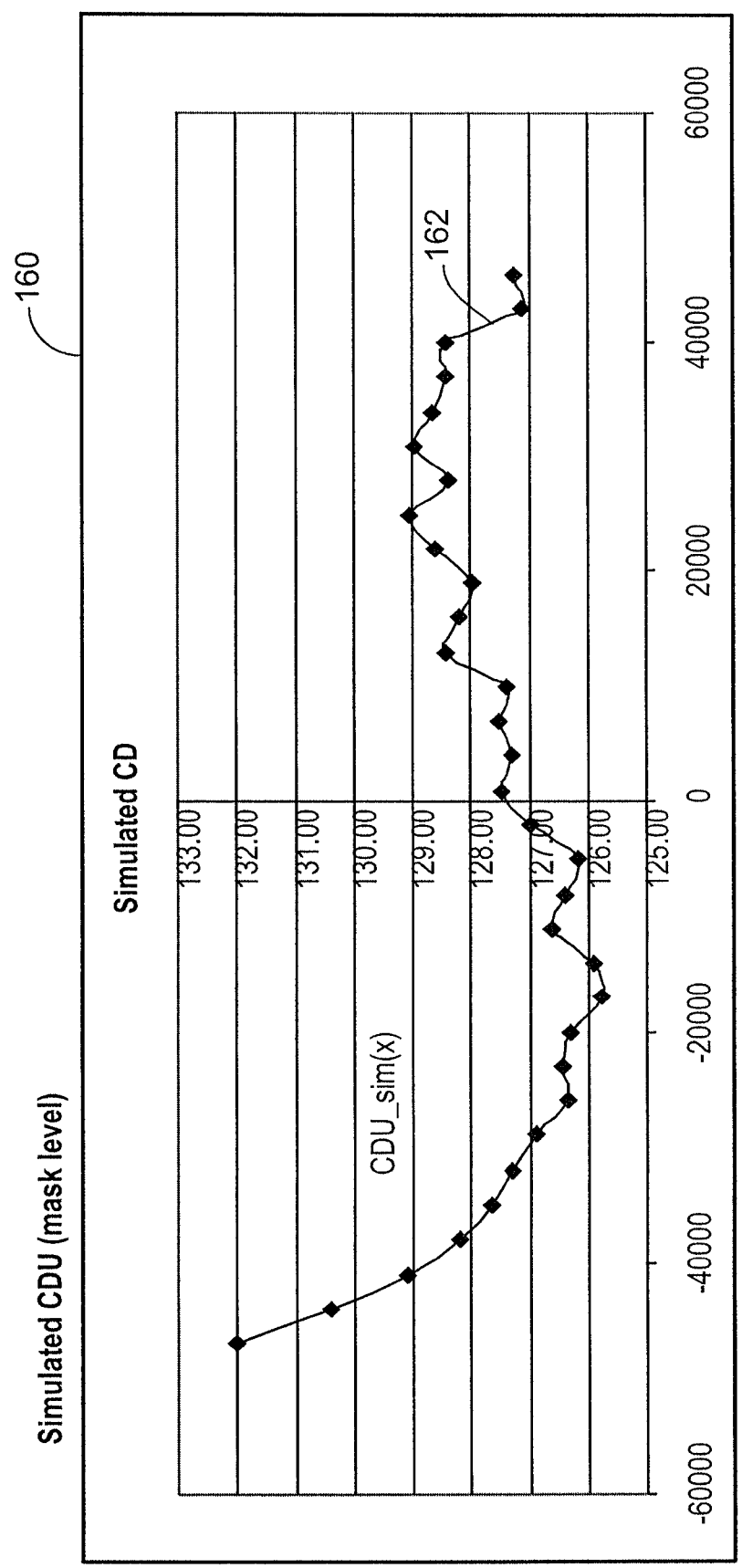
FIG. 3 is a graph of example simulated one-dimensional global behavior of the critical dimension of a photomask.

FIG. 3 is a graph 160 of simulated one-dimensional global behavior of the critical dimension of a photomask. A curve 162 of a function CDU_sim(x) representing the critical dimension as a function of position indicates that the critical dimension values range from about 125.8 to 132 (half pitch in nanometers at the mask level).

Figure 4:
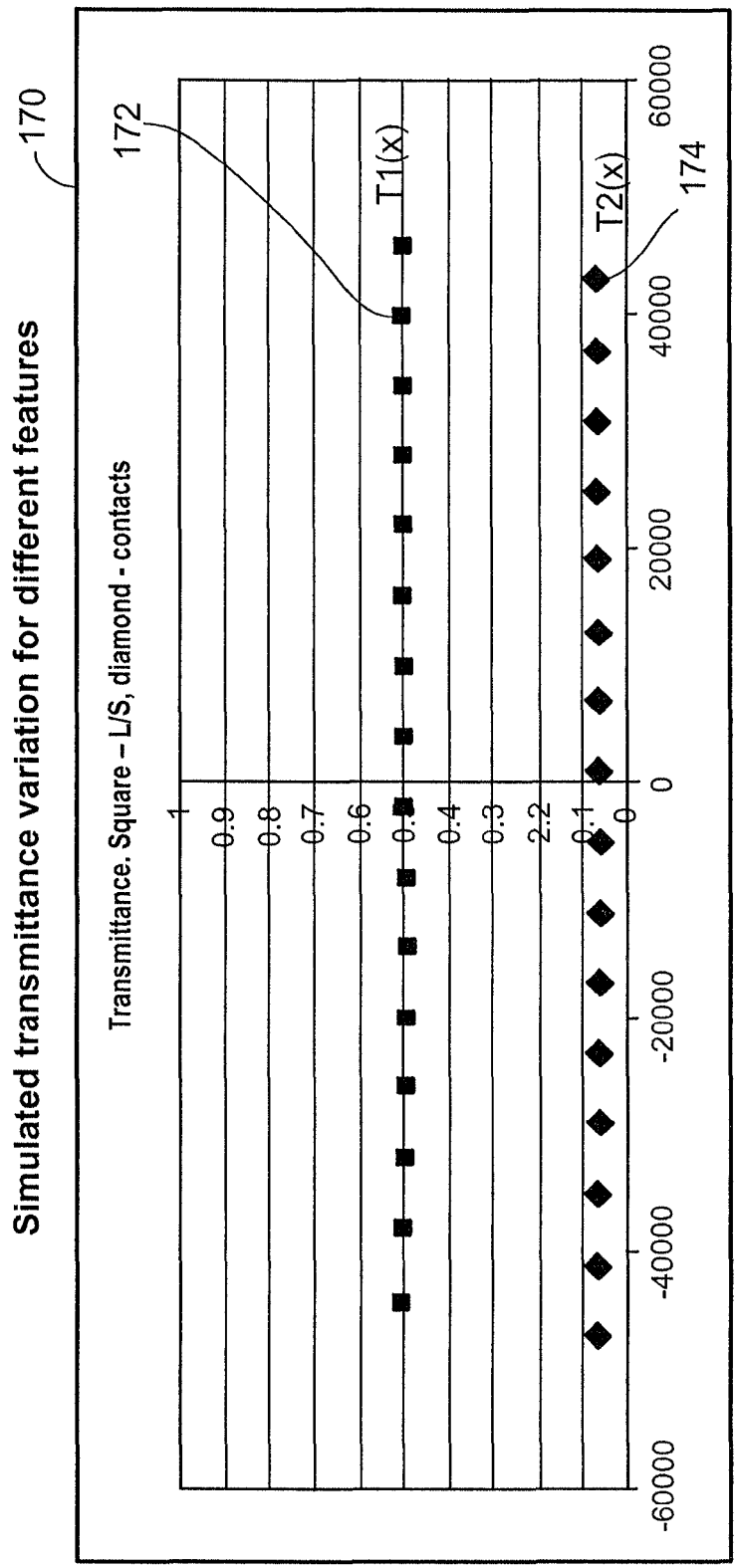
FIG. 4 is a graph of example one-dimensional behavior of simulated transmittance values for two features positioned alternately on a mask.

FIG. 4 is a graph 170 of one-dimensional behavior of simulated transmittance values for two features that are positioned alternately on a mask. A group of transmittance values 172, represented as $T1(x)$, represent the critical dimensions of line openings (e.g., similar to the line opening 120 of FIG. 2C) of the photomask. A group of transmittance values 174, represented as $T2(x)$, represent critical dimensions of contact openings (e.g., similar to the contact opening 130 of FIG. 2D) of the photomask.

In graph 170, with a scale of 0 to 1, the transmittance values 172 are all approximately equal to one another, and the transmittance values 174 are all approximately equal to one another. Both of the transmittance values 172 and 174 vary around their mean transmittance. The transmission values for contact openings are proportional to the square of critical dimension ($CD^2$), whereas for line openings, the transmission is proportional to CD. Nonetheless, every variation is induced by the same underlying global critical dimension variation. Here, even though the transmission values for contact openings are proportional to the square of the critical dimension, for small variations in critical dimension, the linear approximation in Equation 1 can still be used.

Figure 5:
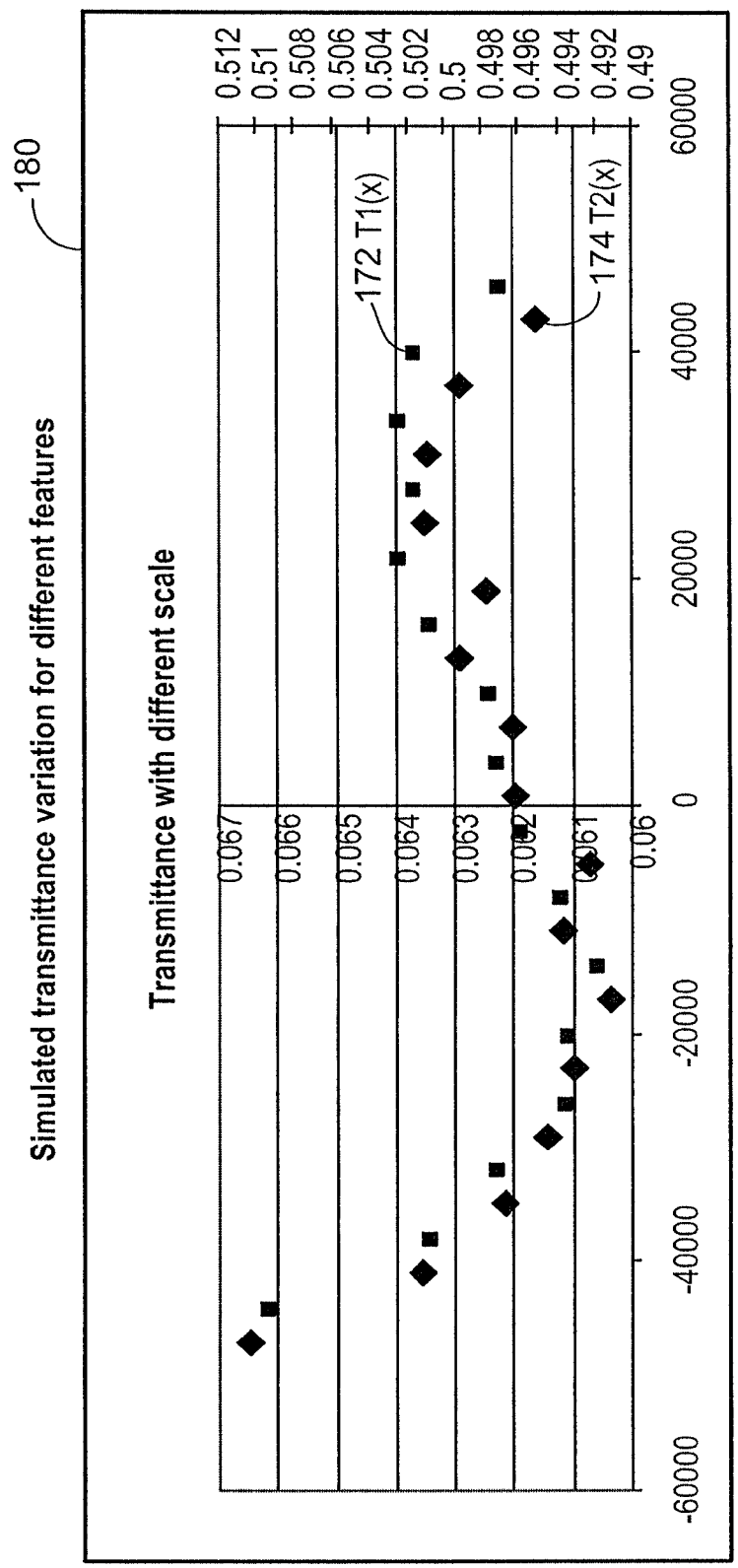
FIG. 5 is a graph showing simulated transmittance values.

Referring to FIG. 5, a graph 180 shows the transmittance values 172 (shown in squares) and 174 (shown in diamonds) in greater detail. In the figure, the transmittance values 172 and 174 are shown in different scales and with different biases to demonstrate the correlation between both variations. The graph 180 shows that the transmittance values 172 range from about 0.492 to about 0.51, and the transmittance values 174 range from about 0.0604 to about 0.0665.

Figure 6:
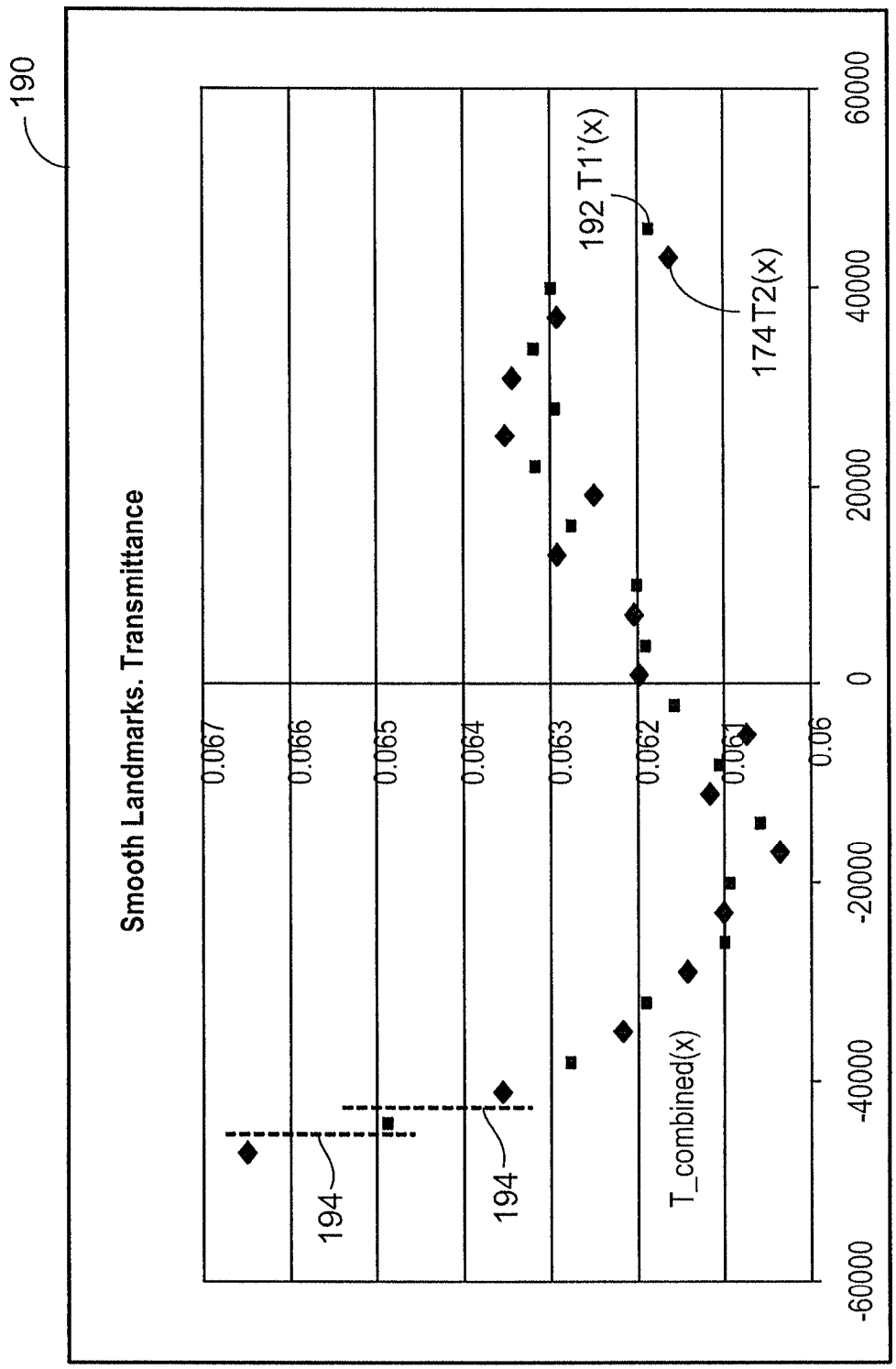
FIG. 6 is a graph showing two groups of transmittance values presented together in the same scale.

Referring to FIG. 6, a graph 190 shows the two groups of transmittance values 172 and 174 being presented together in the same scale. A transformation P( ) was applied to the transmittance values 172 ($T1(x)$) to generate transformed transmittance values 192, represented as $T1'(x) = P(T1(x))$. For example, the transformation P( ) can be a polynomial transformation. A combined measurement function T_combined(x) is defined to represent the transmission values 174 and 192, such that T_combined(x) passes all the transmission values 174 ($T2(x)$) and 192 ($T1'(x)$) at corresponding positions x. The combined measurement function T_combined(x) can be, for example, a polynomial function. The coefficients of the transformation P( ) are selected to optimize the "stitching" (or combining) of the transmittance values 172 and the transformed transmittance values 192, such that the combined measurement function T_combined(x) has a maximum smoothness (or minimum curvature) at locations 194 where the stitching occurs, each location 194 being a boundary between a transmission value 174 and a transmission value 192.

Several measures can be used to optimize the stitching of the two sets of measurement values 174 ($T2(x)$) and 192 ($T1'(x)$). In some implementations, a target function $F(x)$ is defined to represent the "smoothness" of the stitching of the two sets of transmission values $T2(x)$ and $T1'(x)$. The coefficients of the transformation P( ) are selected to optimize the target function $F(x)$.

In some implementations, boundaries (e.g., 194) between the transmittance values 174 ($T2(x)$) and 192 ($T1'(x)$) are identified, and for each boundary 194, the step or difference between the transmittance value 174 on one side of the boundary 192 and the transmittance value 192 on the other side of the boundary 192 is calculated. The target function F( ) can be defined as the sum of the squares of the steps at all the boundaries 192. The coefficients of the transformation P( ) are selected to minimize the target function F( ).

In some implementations, the curvature of the combined measurement function T_combined(x) is calculated by determining its second derivative T_combined"(x). The target function F( ) can be defined as the sum of the squares of the second derivatives at all the boundaries 192. The coefficients of the transformation P( ) are selected to minimize the target function F( ).

In some implementations, the target function F( ) can be defined as the integral of the squares of the second derivatives for all locations. The coefficients of the transformation P( ) are selected to minimize the target function F( ).

Because all the groups of transmission values are influenced by the underlying critical dimension variation, the combined measurement function T_combined(x) has a curvature that is equal to or larger than the curvature of a function representing the global critical dimension variation. Optimizing coefficients of the transformation P( ) to achieve the minimum curvature for the combined measurement function T_combined(x) means that we introduce as few variations or deviations as possible when sampling at the groups of landmarks having different transmission properties and stitching the measurements together.

FIG. 7A is a graph 200 that shows the simulated critical dimension variation CDU_sim(x), as represented by a curve 202. FIG. 7B is a graph 210 that shows the combined measurement function T_combined(x) (represented by a curve 212) that is determined based on the two sets of transmittance measurements 172 and 174. The global critical dimension uniformity can be determined based on the combined measurement function T_combined(x) according to Equation 1. Thus, the combined measurement function T_combined(x) is a good approximation of the global critical dimension uniformity.

Comparing the curve 212 in FIG. 7B with the curve 202 in FIG. 7A shows that the global and local behavior of the critical dimension have been restored from the two sets of measurements 172 and 174. The restored global critical dimension variation, as represented by the curve 212, is very similar to the simulated critical dimension variation, as represented by the curve 202, indicating that the simulations comply with the initial assumptions: (1) The global critical dimension variation defines the behavior of all the particular pattern-dependent critical dimensions, and (2) the critical dimension variations are small, and linear approximation for the transmittance behavior corresponds to linear approximation of critical dimension. The simulations indicate that when the above assumptions are true, the landmark method can be used to accurately determine the global critical dimension uniformity.

Figure 8:
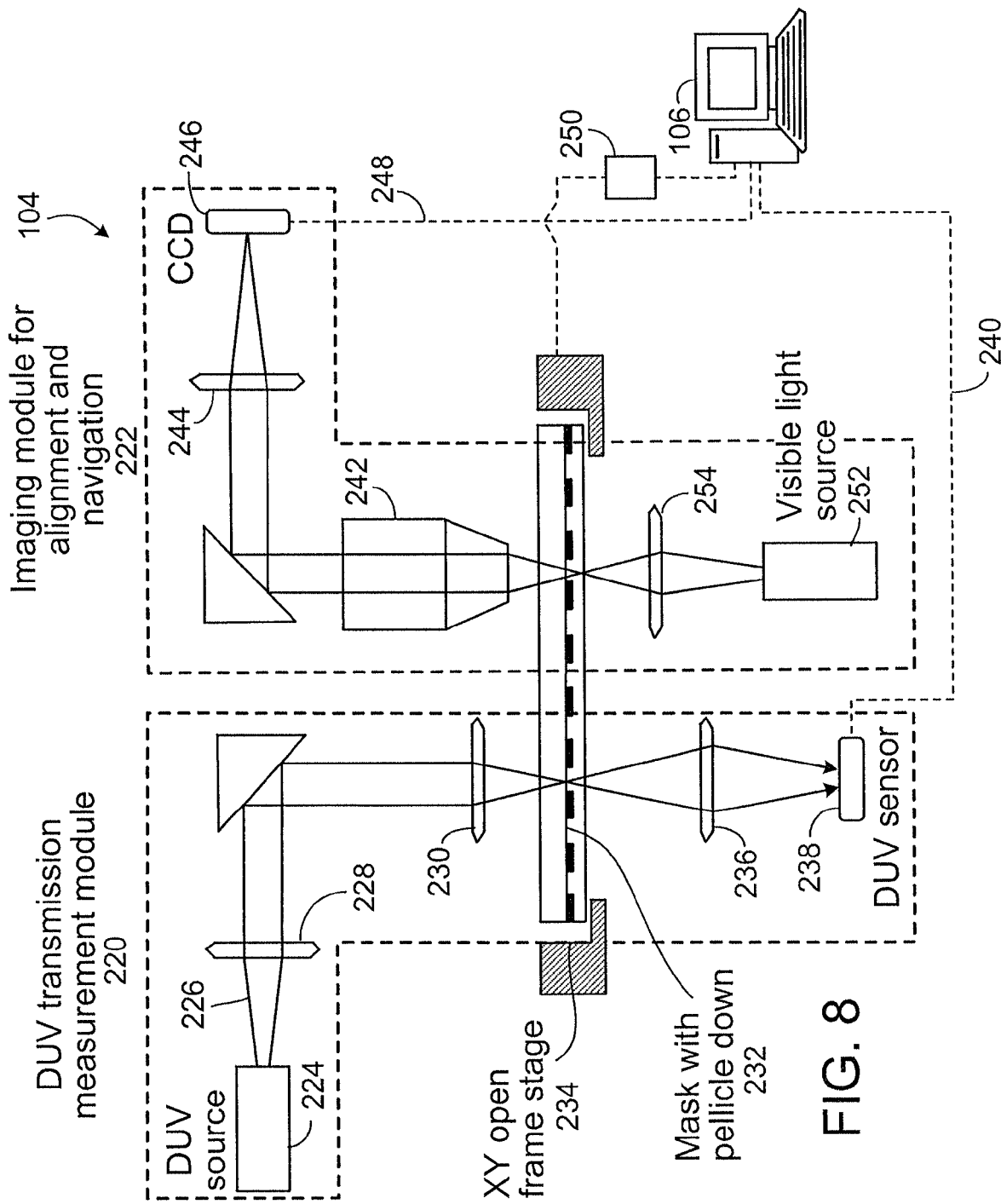
FIG. 8 is a schematic diagram of an example mask transmission measurement tool.

FIG. 8 is a schematic diagram of an example mask transmission measurement tool 104. The tool 104 includes a deep ultraviolet (DUV) transmittance measurement module 220 and an imaging module for alignment and navigation 222. The DUV transmittance measurement module 220 includes a wide-band DUV light source 224 that generates a DUV beam 226, which is collimated by a condenser lens 228. A second condenser lens 230 focuses the DUV beam 226 to a small spot size on the front side of a photo mask 232. The photo mask 232 is installed on a moving XY stage 234. DUV illuminated spot is projected by a collecting lens 236 onto a fast DUV sensor 238. Signals from the DUV sensor 238 is transferred through a signal line 240 to a computing system 106 for data acquisition and mapping.

The imaging module 222 enables alignment and navigation across the photo mask 232. The imaging module 222 includes an objective lens 242, a tube lens 244, and a charged coupled device (CCD) camera 246. Images from the CCD camera 246 of alignment marks on the photo mask 232 at the focus of objective lens 242 are transferred through a signal line 248 to the computing system 106, and exact coordinates of all points are registered by stage control 250, for the full mapping process. Imaging module 222 receives the light for imaging from a light source 252, which is imaged to the objective lens 242 focal point by a condenser lens 254.

In some implementations, the transmittance measurement tool 104 is a non-imaging tool, which is a tool in which a one-to-one correspondence between an object and an image does not exist. Since there is not a one-to-one correspondence between the object and the image, points of a source collected at a target plane are generally not distinguishable and an image is not formed at a detector. While, generally, in a non-imaging tool, an image is not formed at the detector, unintentional correspondence between an object and an image at the target plane may occur and/or a poor image could be formed. However, in the measurement and mapping system any such image would not be detected by the non-imaging detector or used to generate the transmittance or critical dimension distribution.

The transmittance measurement tool 104 can measure the transmittance of a beam having a large spot size, in which the average transmittance over the area of the spot is measured. An example of the transmittance measurement tool 104 is Carl Zeiss Galileo® tool, available from Carl Zeiss SMS GmbH, Jena, Germany. By using a non-imaging detection method, a fast and sensitive DUV sensor 238 can be used, such as a photodiode, a photomultiplier tube (PMT), or a phototube. The DUV sensor 238 can have a wide dynamic range of more than five orders of magnitude and a high level of signal-to-noise ratio. Each measurement using the DUV sensor 238 may take a fraction of a second, and averaging several measurements can increase the signal-to-noise ratio to accuracy levels of about 0.1% transmittance or better. High accuracy of transmittance variation measurements can be transformed to the critical dimension distribution map according to a linear ratio that is found to exist between critical dimension variations and transmittance variations, as described in more detail in PCT application PCT/EP2009/050004, filed on Jan. 2, 2009, herein incorporated by reference. The signals from the DUV sensor 238 are stored and processed by the computing system 106 as described above.

Figure 9:
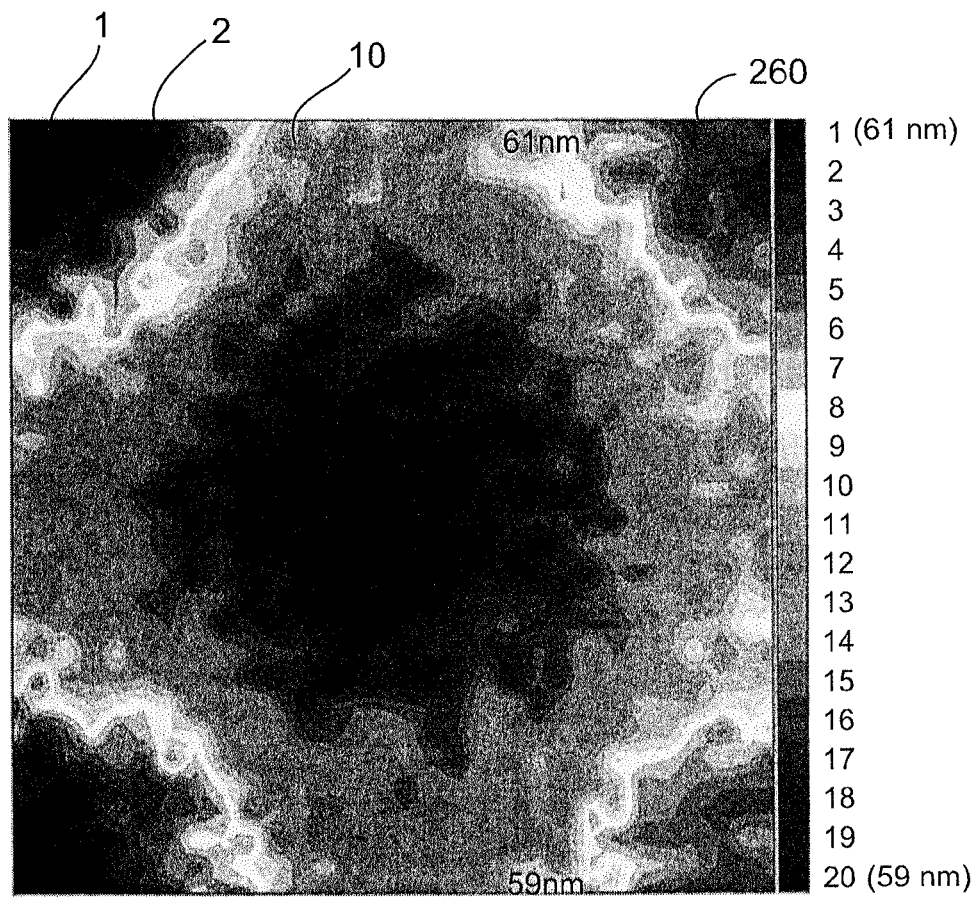
FIG. 9 is a graph of an example simulated two-dimensional global critical dimension distribution map of a photo mask having two types of landmarks.

FIG. 9 is a graph of an example simulated two-dimensional global critical dimension distribution map 260 of a photo mask having two types of landmarks: contact openings and line/space arrays. The critical dimension values were calculated for nodes located on a regularly spaced grid. The target critical dimension is 60 nm, the pitch of the line/space array is 128 nm, and the pitch of contact openings is 256 nm. The global behavior of the critical dimension is simulated as a two-dimensional polynomial function with added noise. The critical dimension distribution map 260 indicates that the critical dimension has a radial behavior that varies from 58.8 nm (near the center region) to 61.82 nm (near the four corners). The mean critical dimension is 59.95 nm.

Figure 10:
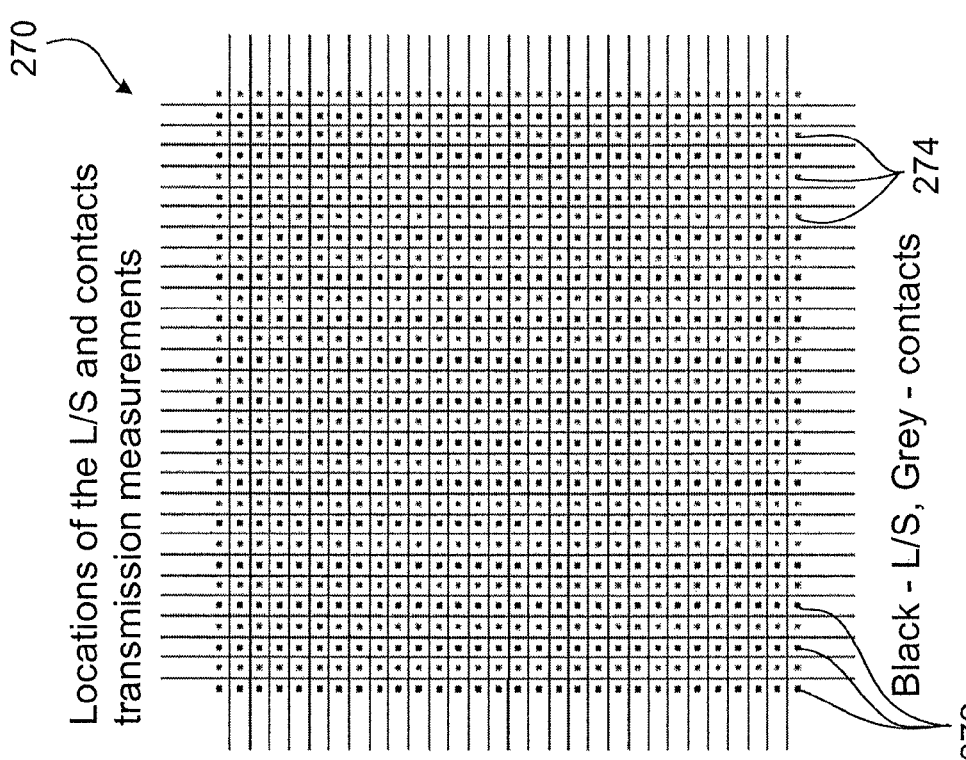
FIG. 10 is a diagram showing example locations of features where the transmission measurements are made on a photo mask.

FIG. 10 is a diagram 270 showing the locations of the line/space arrays 272 (shown as black dots) and contact openings 274 (shown as gray dots) where the transmission measurements are made on the photo mask having the critical dimension distribution shown in FIG. 9. In this example, the line/space arrays 272 and the contact openings 274 are located on alternating columns. Measurements of transmission are made at nodes located on a regular grid and interlacing in the x-direction.

Figure 11:
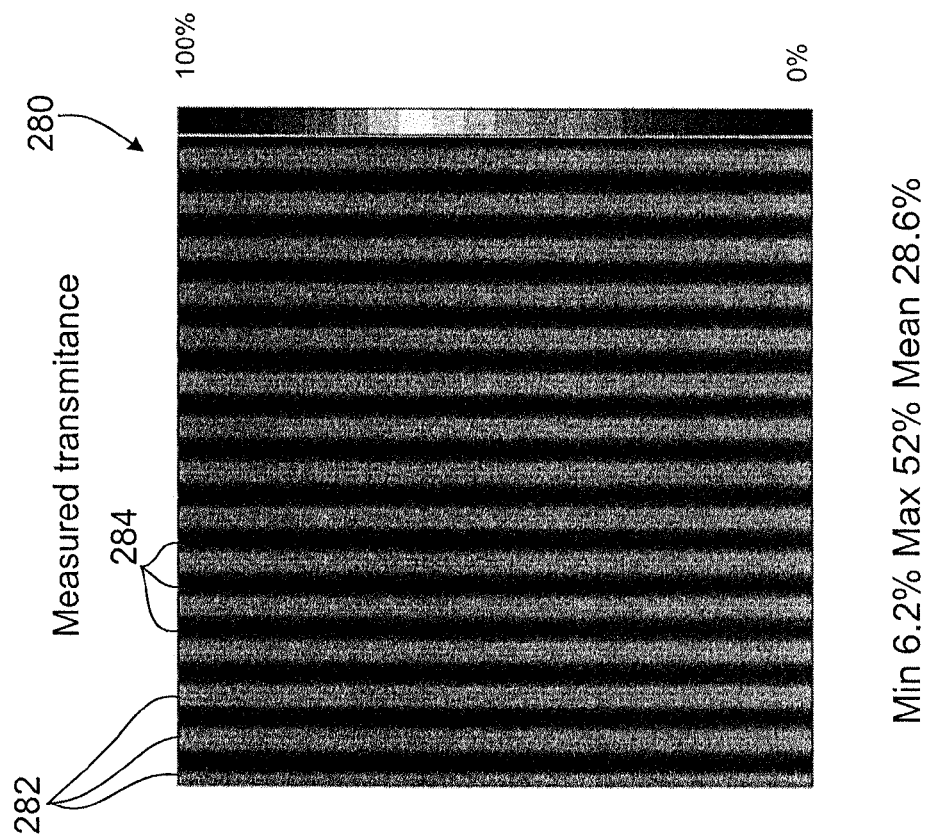
FIG. 11 is a graph showing example transmission values at line/space arrays and contact openings.

FIG. 11 is a graph 280 showing transmission values 282 at the line/space arrays 272 and transmission values 284 at the contact openings 274. The graph 280 shows that the transmission values 282 at the line/space arrays 272 are higher than the transmission values 284 at the contact openings 274.

The minimum transmittance is 6.2%, the maximum transmittance is 52%, and the mean transmittance is 28.6%. The differences between the transmittance values 282 at the line/space arrays 272 and the transmittance values 284 at the contact openings 274 are high, so by examining the graph 280 it is difficult to determine the variation in transmittance caused by the underlying critical dimension variation. In order to more clearly see how the transmittance measurements are affected by the global critical dimension variation, it is useful to separate the transmittance measurements into two groups according to the types of patterns that were measured.

Figure 12:
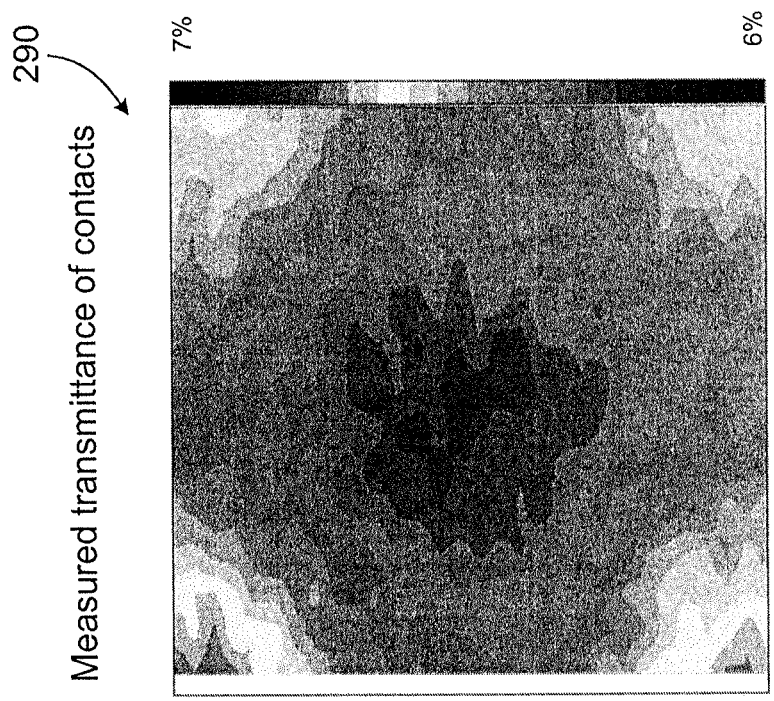
FIG. 12 is a graph showing example transmission values at contact openings.

FIG. 12 is a graph 290 showing transmission values 284 at the contact openings 274. The minimum transmittance is 6.2%, the maximum transmittance is 6.8%, and the mean transmittance is 6.5%.

Figure 13:
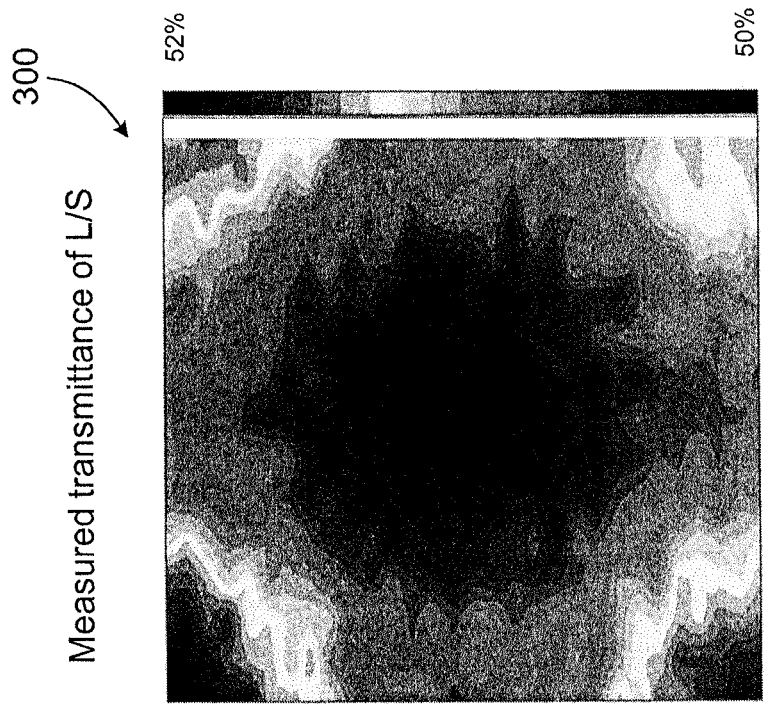
FIG. 13 is a graph showing example transmission values at line/space arrays.

FIG. 13 is a graph 300 showing transmission values 282 at the line/space arrays 272. The minimum transmittance is 49.8%, the maximum transmittance is 52.3%, and the mean transmittance is 50.6%. FIGS. 12 and 13 show that each group of transmittance measurements has the same trend as the global critical dimension and presents radial behavior. The two groups of transmittance measurements have variations that are induced by the same global factor, but have different ranges and biases.

FIG. 14 is a graph 310 showing a critical dimension uniformity map that is reconstructed based on the two groups of measurements 284 and 282 shown in FIGS. 12 and 13, respectively, using the landmark method. A transformation was applied to one group of measurements, and the two groups of measurements were stitched together in a way such that a surface representing the relationship between the transmission values and the measurement locations has the smoothest curvature.

The reconstructed critical dimension variation has a minimum value of 58.7 nm, a maximum value of 61.9 nm, and a mean value of 59.96 nm, which are similar to the values shown in FIG. 9.

FIG. 15 is a graph 320 showing the difference between the reconstructed critical dimension distribution of FIG. 14 and the simulated global critical dimension distribution of FIG. 9. The difference is small, ranging from −0.06 nm to 0.07 nm, with a sigma value of 0.03 nm. FIGS. 14 and 15 indicate that the reconstruction of the global critical dimension variation from the two groups of transmission measurements is good. The minor differences between the reconstructed and simulated critical dimension maps represent noise.

Figure 16:
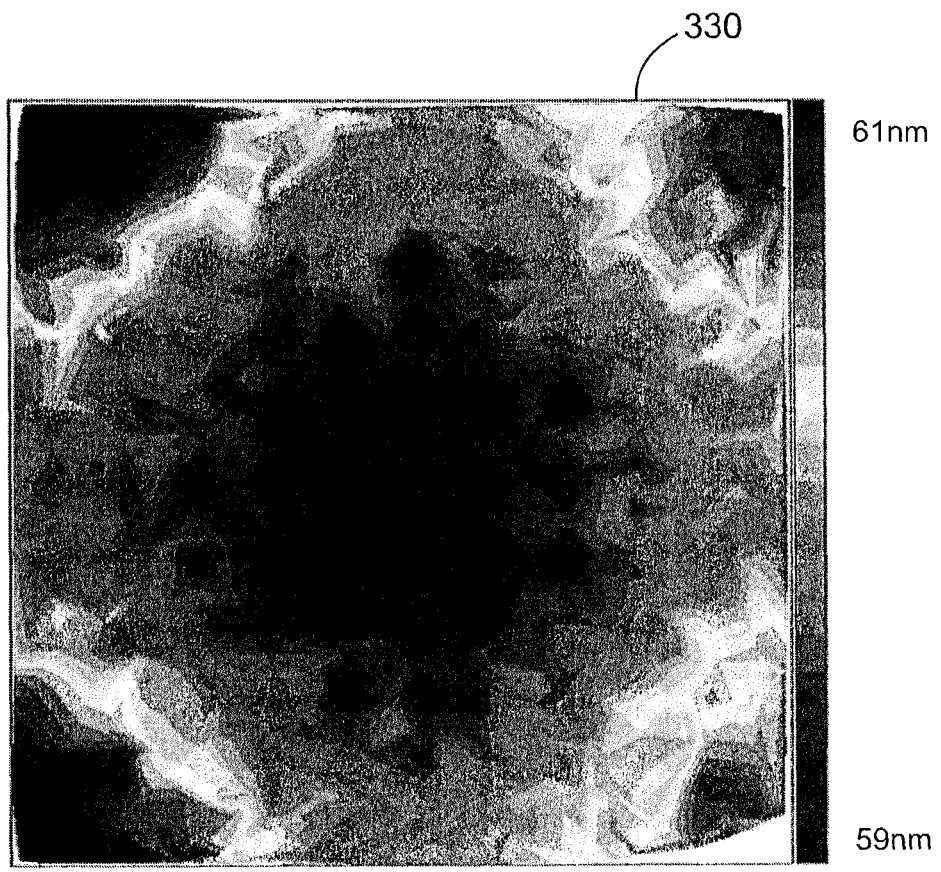
FIG. 16 is a graph of an example simulated two-dimensional global critical dimension distribution map of a photo mask having two types of landmarks.

FIG. 16 is a graph of an example simulated two-dimensional global critical dimension distribution map 330 of a photo mask having two types of landmarks: contact openings and line/space arrays. In this example, the line/space arrays and the contact openings are distributed on a random grid. The simulated global critical dimension values were calculated for locations where the contact openings and line/space arrays were located. The critical dimensions ranged from a minimum of 58.8 nm to a maximum of 61.7 nm, with a mean value of 59.93 nm.

Figures 17, 18:
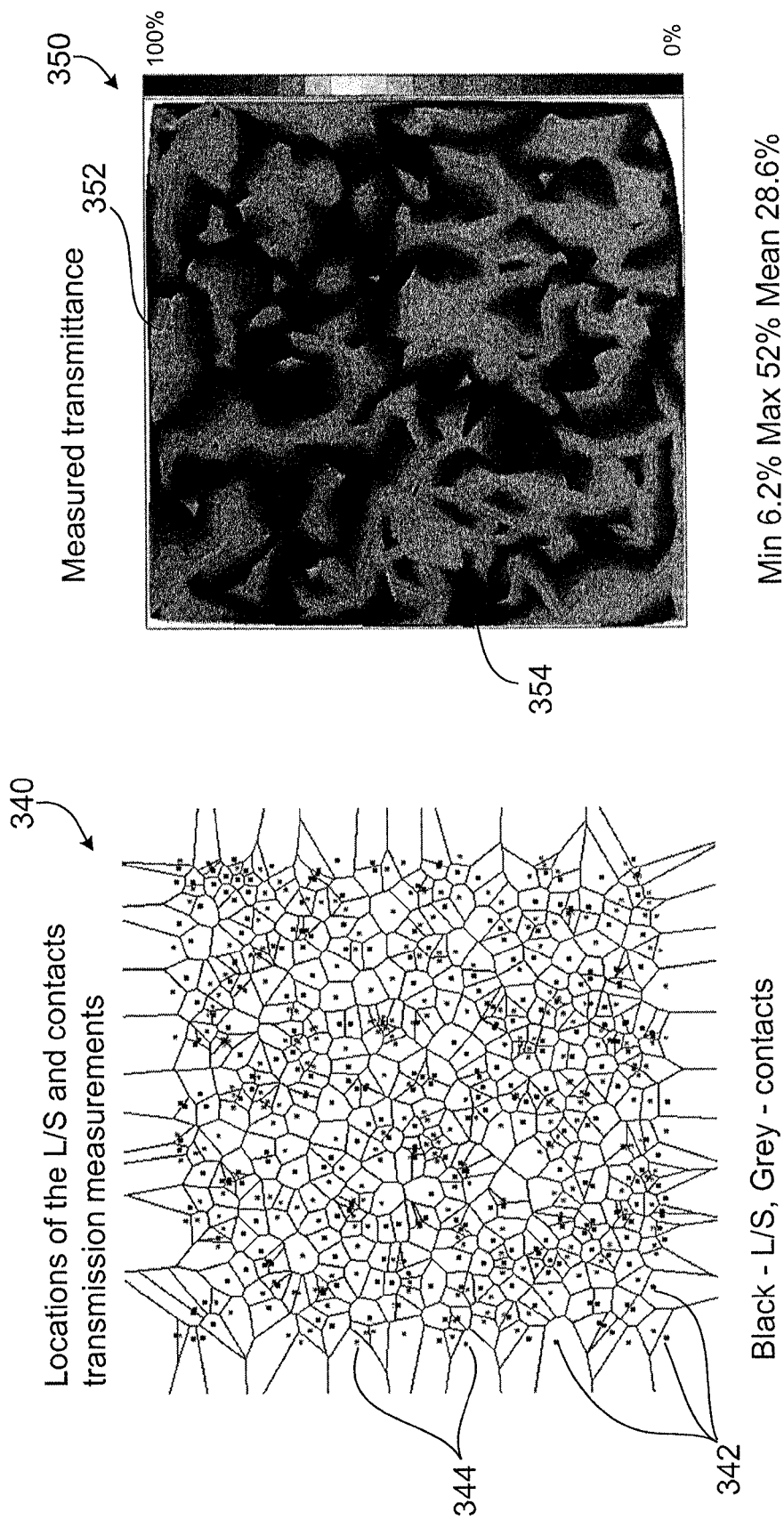
FIG. 17 is a diagram showing the locations of line/space arrays and contact openings where transmission measurements are made on a photo mask.
FIG. 18 is a graph showing transmission values at line/space arrays and contact openings.

FIG. 17 is a diagram 340 showing the locations of the line/space arrays 342 (shown as black dots) and contact openings 274 (shown as gray dots) where the transmission measurements are made on the photo mask having the critical dimension distribution shown in FIG. 16. In this example, measurement points of the line/space arrays 342 and the contact openings 344 are located on a random grid, and there is no correlation between the positions of the line/space arrays 342 and the positions of the contact openings 344.

FIG. 18 is a graph 350 showing transmission values 352 at the line/space arrays 342 and transmission values 354 at the contact openings 344. In the graph 350, the transmission values appear to vary randomly across the mask, ranging from the minimum value of 6.2% to the maximum value of 52%, with a mean value of 28.6%. The difference between the transmittance values 352 at the line/space arrays 342 and the transmittance values 354 at the contact openings 344 is high, so by examining the graph 350 it is difficult to determine the variation in transmittance caused by the underlying critical dimension variation. In order to more clearly see how the transmittance measurements are affected by the global critical dimension variation, it is useful to separate the transmittance measurements into two groups according to the types of patterns that were measured.

Figure 19:
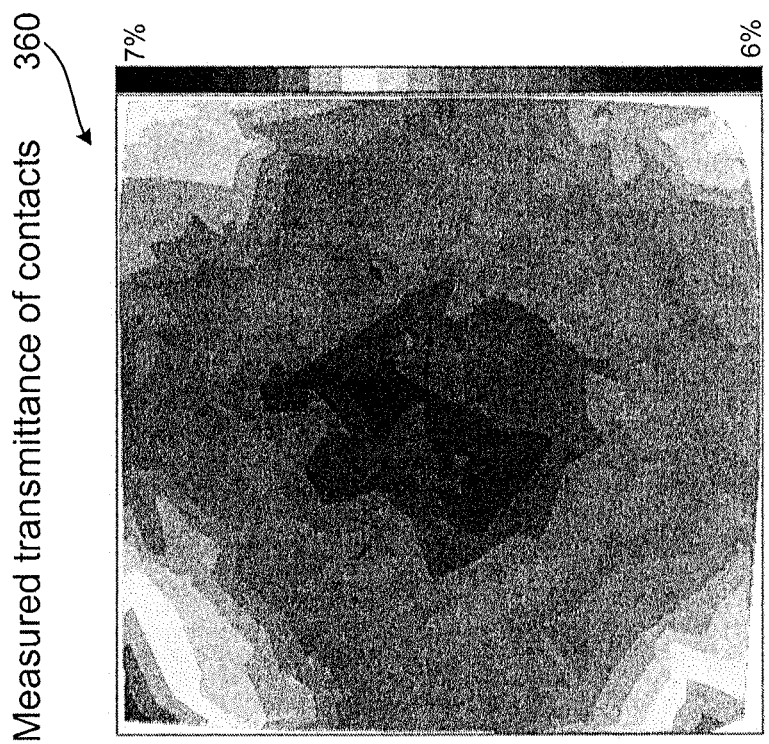
FIG. 19 is a graph showing example transmission values at contact openings.

FIG. 19 is a graph 360 showing transmission values at the contact openings 344. The transmittance values range from a minimum value of 6.2% to a maximum value of 6.8%, with a mean value of 6.5%.

Figure 20:
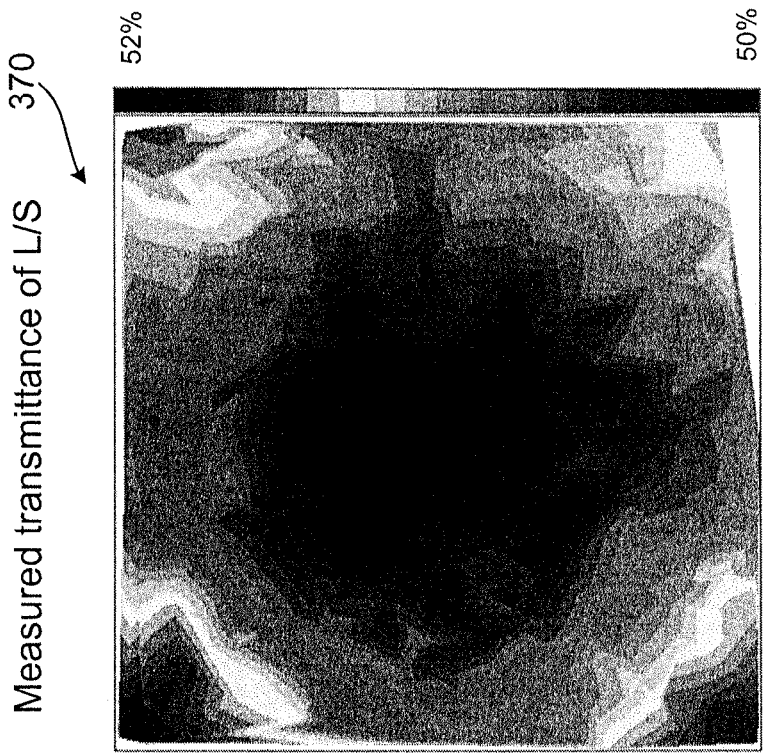
FIG. 20 is a graph showing example transmission values at line/space arrays.

FIG. 20 is a graph 370 showing transmission values at the line/space arrays 342. The transmittance values range from a minimum value of 49.8% to a maximum value of 52.1%, with a mean value of 50.6%. FIGS. 19 and 20 show that each group of transmittance values has the same trend as the global critical dimension and presents radial behavior. The two groups of transmittance values have variations that are induced by the same global factor, but have different ranges and biases.

Figure 21:
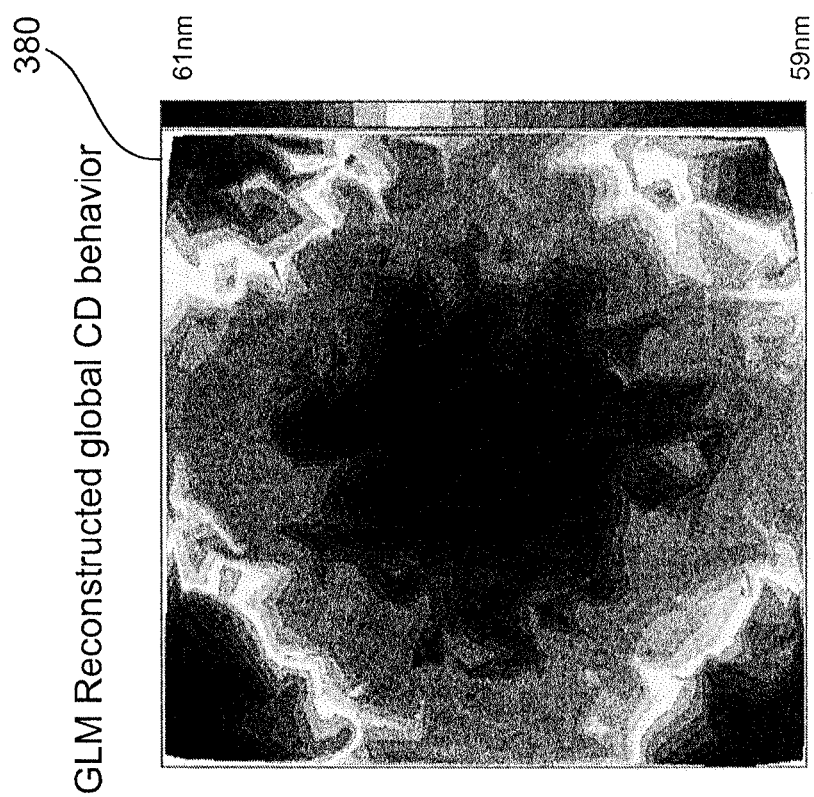
FIG. 21 is a graph showing an example critical dimension uniformity map.

FIG. 21 is a graph 380 showing a critical dimension uniformity map that is reconstructed based on the two groups of measurements shown in FIGS. 19 and 20 using the landmark method. A transformation was applied to one group of measurements, and the two groups of measurements were stitched together in a way such that a surface representing the relationship between the transmission values and the measurement locations has the smoothest curvature.

The reconstructed critical dimension variation has a minimum value of 58.7 nm, a maximum value of 61.7 nm, and a mean value of 59.92 nm, which are similar to the values shown in FIG. 16.

Figure 22:
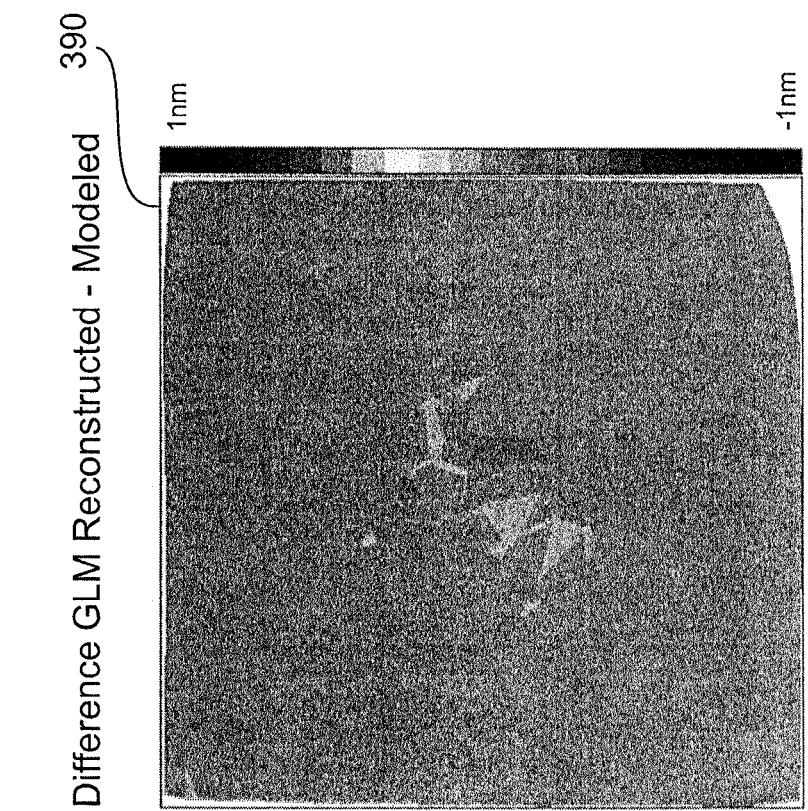
FIG. 22 is a graph showing the difference between a reconstructed critical dimension distribution and a simulated global critical dimension distribution.

FIG. 22 is a graph 390 showing the difference between the reconstructed critical dimension distribution of FIG. 21 and the simulated global critical dimension distribution of FIG. 16. As shown in FIG. 22, the difference is quite small, ranging from −0.07 nm to 0.08 nm, with a sigma value of 0.03 nm. FIGS. 21 and 22 indicate that the reconstruction of the global critical dimension variation from the two groups of transmission measurements is good. The minor differences between the reconstructed and simulated critical dimension maps represent noise.

Figure 23:
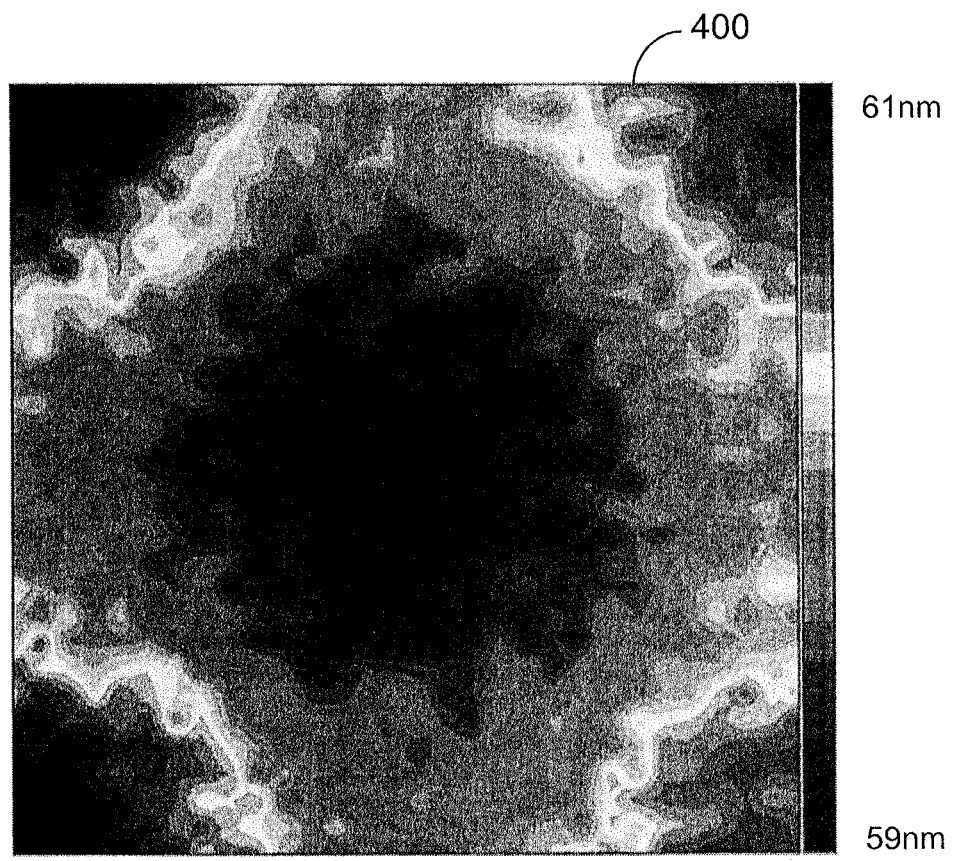
FIG. 23 is a graph of an example simulated two-dimensional global critical dimension distribution map of a photo mask having two types of landmarks.

FIG. 23 is a graph of an example simulated two-dimensional global critical dimension distribution map 400 of a photo mask having two types of landmarks: contact openings and line/space arrays. The critical dimension values were calculated for nodes located on a rectangular grid in which the line/space arrays and the contact openings are arranged according to typical die structures. The critical dimensions ranged from a minimum of 58.8 nm to a maximum of 61.8 nm, with a mean value of 59.96 nm.

Figure 24:
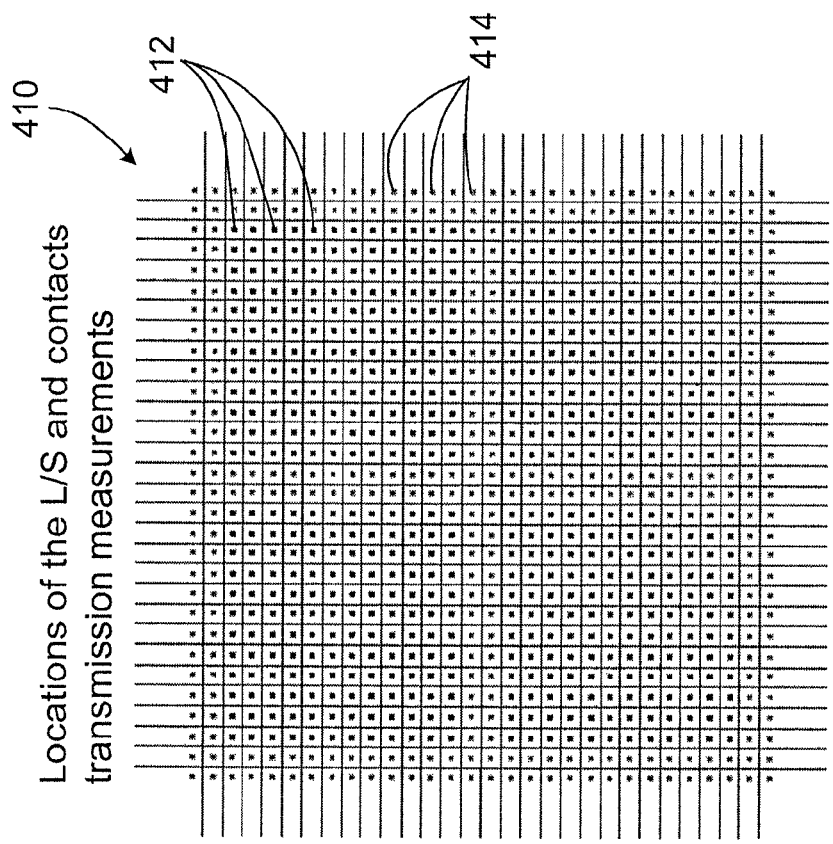
FIG. 24 is a diagram showing the locations of line/space arrays and contact openings where transmission measurements are made on a photo mask.

FIG. 24 is a diagram 410 showing the locations of the line/space arrays 412 (shown as black dots) and contact openings 414 (shown as gray dots) where the transmission measurements are made on the photo mask having the critical dimension distribution shown in FIG. 23. In this example, the line/space arrays 412 are located in regions where typical dies would reside, and the contact openings 414 are located in regions surrounding the die regions.

Figure 25:
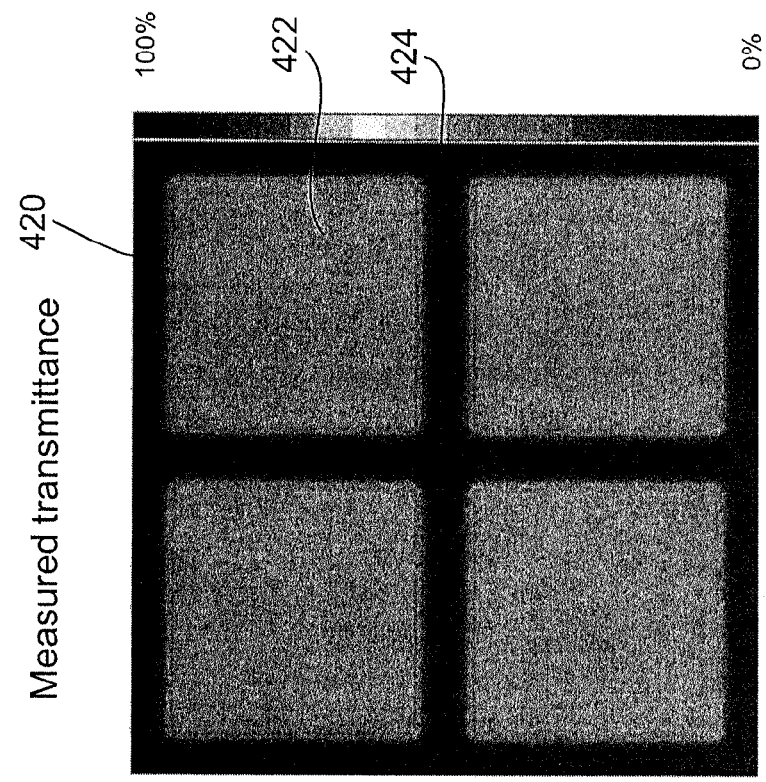
FIG. 25 is a graph showing transmission measurements at line/space arrays and contact openings.

FIG. 25 is a graph 420 showing transmission measurements at the line/space arrays 412 and the contact openings 414. In the graph 420, the transmission values vary significantly. The transmittance values in the regions 422 where the line/space arrays 412 are located are much higher than the transmittance values in the surrounding regions 424 where the contact openings 424 are located. The transmittance values range from a minimum value of 6.2% to a maximum value of 52%, with a mean value of 35%. The difference between the transmittance at the contact openings and the transmittance at the line/space arrays is very high, so by examining the graph 420 it is difficult to determine the variation in transmittance caused by the underlying critical dimension variation. In order to more clearly see how the transmittance measurements are affected by the global critical dimension variation, it is useful to separate the transmittance measurements into two groups according to the types of patterns that were measured.

Figure 26:
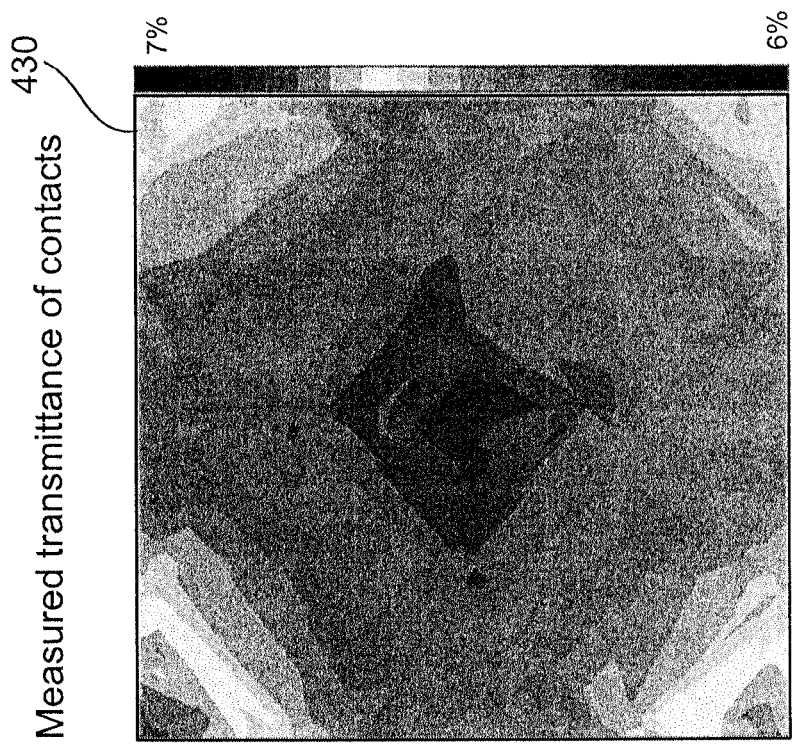
FIG. 26 is a graph showing transmission measurements at contact openings.

FIG. 26 is a graph 430 showing transmission measurements at the contact openings 414. The transmittance values range from a minimum value of 6.2% to a maximum value of 6.8%, with a mean value of 6.5%.

Figure 27:
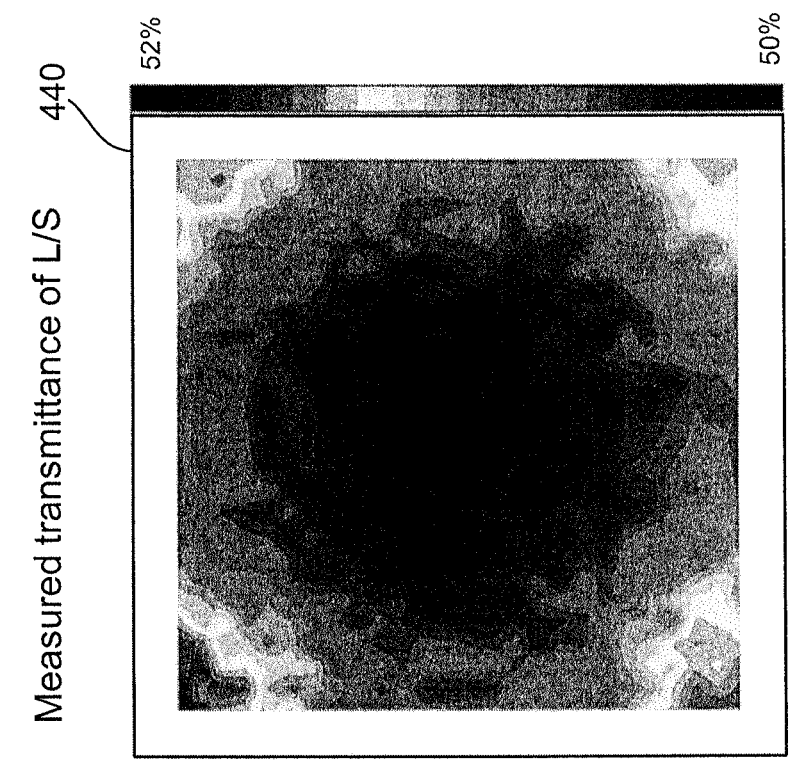
FIG. 27 is a graph showing transmission measurements at line/space arrays.

FIG. 27 is a graph 440 showing transmission measurements at the line/space arrays 412. The transmittance values range from a minimum value of 49.8% to a maximum value of 52.1%, with a mean value of 50.6%. FIGS. 26 and 27 show that each group of transmittance measurements has the same trend as the global critical dimension and presents radial behavior. The two groups of transmittance measurements have variations that are induced by the same global factor, but have different ranges and biases.

Figure 28:
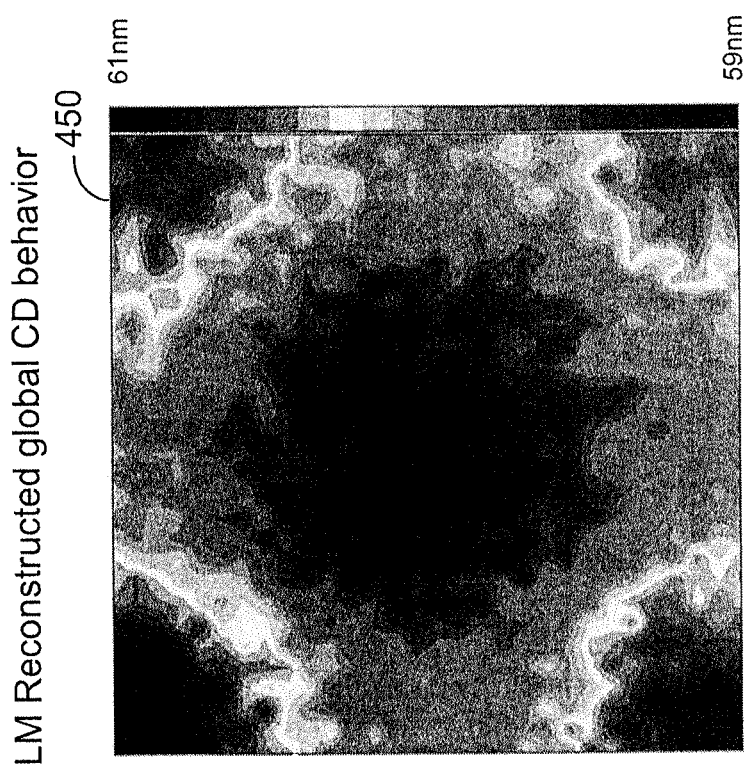
FIG. 28 is a graph showing a critical dimension uniformity map that is constructed based on two groups of measurements using the landmark method.

FIG. 28 is a graph 450 showing a critical dimension uniformity map that is constructed based on the two groups of measurements shown in FIGS. 26 and 27 using the landmark method. A transformation was applied to one group of measurements, and the two groups of measurements were stitched together in a way such that a surface representing the relationship between the transmission values and the measurement locations has the smoothest curvature.

The reconstructed critical dimension variation has a minimum value of 58.8 nm, a maximum value of 61.7 nm, and a mean value of 59.97 nm, which are similar to the values shown in FIG. 23.

Figure 29:
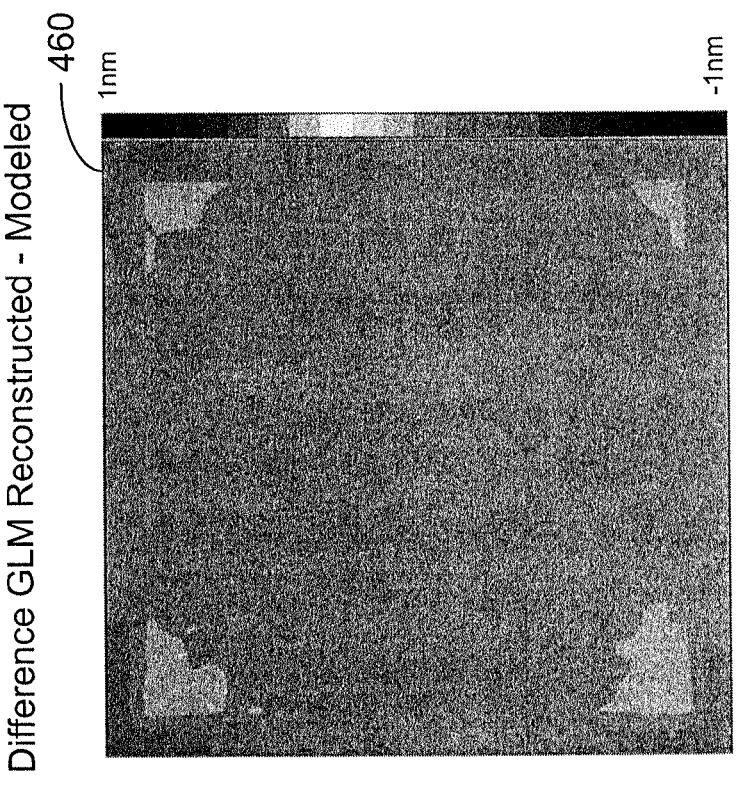
FIG. 29 is a graph showing the difference between a reconstructed critical dimension distribution and a simulated global critical dimension distribution.

FIG. 29 is a graph 460 showing the difference between the reconstructed critical dimension distribution of FIG. 28 and the simulated global critical dimension distribution of FIG. 23. As shown in FIG. 29, the difference is quite small, ranging from −0.08 nm to 0.1 nm, with a sigma value of 0.03 nm. FIGS. 28 and 29 indicate that the reconstruction of the global critical dimension variation from the two groups of transmission measurements is good. The minor differences between the reconstructed and simulated critical dimension maps represent noise.

The following describes how measurement values for different groups of landmarks can be combined or stitched together using finite difference methods.

We assume there are several groups of landmarks, and for every landmark measured, the critical dimension variation is proportional to the variation of global factors:

$$CD_i(x,y) = CD_i^0 + CD_i^s * \delta F(x,y) + N_i(x,y) \quad \text{(Equation 3)}$$

where $CD_i(x,y)$ represents the critical dimension at location $(x,y)$ for the i-th type of pattern, $\delta F(x,y)$ represents the variation in the global factor F, $CD_i^0$ represents a bias value, $CD_i^s$ represents a slope or scale factor, and $N_i(x,y)$ represents a noise factor. Equation 3 assumes that every group of landmarks is affected by the same variation in the global factor F, but different groups may have different biases and scaling. We wish to reconstruct one specific critical dimension uniformity distribution $CD_0(x,y)$ by analyzing the measurements from all of the groups of landmarks.

The critical dimensions of different groups of landmarks can be measured differently, such as using different measurement technology. For example, for one group of landmarks, the pattern transmittance can be measured, while at another group of landmarks, capacitance values can be measured.

After the measurements are performed at all the landmarks, we have $$CD_i(l_i^k) = CD_i^0 + CD_i^s * \delta F(l_i^k) + N_i(l_i^k) \quad \text{(Equation 4)}$$

Here, the variable $l_i^k$ represents the measurement location, so $CD_i(l_i^k)$ represents the critical dimension of the i-th type of landmark at location $l_i^k$. Equation 4 is the same as Equation 3 except for using the notation $(l_i^k)$ instead of $(x,y)$. Suppose we have data on the critical dimension of the 0th-type landmark, $CD_0$, at $l_o^k$ location, and we would like to know the critical dimension at all $l_i^k$ locations.

If one knows all the parameters $CD_i^0$, $CD_i^s$, and noise factors $N_i(x,y)$, it is possible to present reconstructed $CD_0$ behavior as:

$$CD_{0\_reconstruct}(l_i^k) = CD_0^0 + CD_0^{s*}(CD_i(l_i^k) - N_i(l_i^k) - CD_i^0)/CD_i^s \quad \text{(Equation 5)}$$

Where $CD_{0\_reconstruct}(l_i^k)$ represents the reconstructed critical dimension value for the 0-th type of landmark at location $l_i^k$. By changing notations, we can present Equation 5 in a simpler way:

$$CD_{0\_reconstruct}(l_0^k) = CD_0(l_0^k) - n_0(l_0^k)$$

$$CD_{0\_reconstruct}(l_i^k) = b_i + a_i * CD_i(l_i^k) - n_i(l_i^k) \quad \text{(Equation 6)}$$

The noise level is not known and cannot be estimated from obtained data, so our goal is to reconstruct the critical dimension behavior with an uncertainty that is equal to or approximates the noise level.

We assume that the critical dimension behavior is smooth, and the noise components have zero average value. The $b_i$ and $a_i$ values are selected to satisfy the condition of the maximum smoothness of the reconstructed critical dimension.

The smoothness of the reconstructed critical dimension behavior can be expressed using the second derivative of the function representing the reconstructed critical dimension:

$$\int \left( \left( \frac{\partial^2 CD(x,y)}{\partial x \partial x} \right)^2 + 2 \left( \frac{\partial^2 CD(x,y)}{\partial x \partial y} \right)^2 + \left( \frac{\partial^2 CD(x,y)}{\partial y \partial y} \right)^2 \right) ds \quad \text{(Equation 7)}$$

This is an isotropic definition of smoothness. One can use a simplified variant, such as the following:

$$\int \left( \left( \frac{\partial^2 CD(x,y)}{\partial x \partial x} \right)^2 + \left( \frac{\partial^2 CD(x,y)}{\partial y \partial y} \right)^2 \right) ds \quad \text{(Equation 8)}$$

or any other similar expressions.

Because we have discrete sets of measurements, we calculate Equation 7 using the finite difference method. Equation 7 is used to determine the smoothness of the reconstructed critical dimension behavior at the boundaries of measurements for different types of landmarks. For example, the boundary can be between a critical dimension measurement for a line/space array and a critical dimension measurement for a contact opening. When calculating Equation 7 using the finite difference method, the finite difference expression that is chosen is dependent on the measurement location. For example, the finite difference expression used for calculating the smoothness at an edge of a square would be different for the finite difference expression used for calculating the smoothness at a corner of the square.

As an example, we assume the measurement points are located on a rectangular grid. In some implementations, it is not necessary to compute the smoothness integral (Equation 8) through all the measurement areas. We can compute just the contributions of the stitching areas in which the smoothness depends on the bias and scaling parameters (e.g., $b_i$ and $a_i$) in Equation 6.

Figure 30:
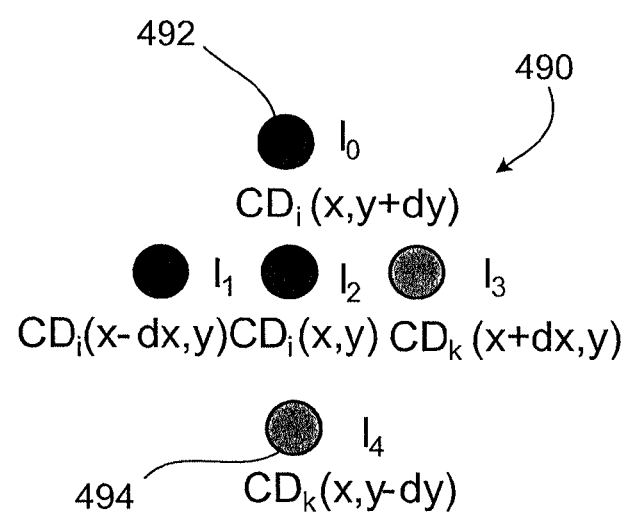
FIG. 30 is a diagram that shows critical dimension measurement points on a rectangular grid in a stitching area.

FIG. 30 is a diagram 490 that shows the critical dimension measurement points on a rectangular grid in the stitching area. Black points 492 represent one group of the measured values, e.g., measurements at the i-th type of landmark, and gray points 494 represent another group of measured values, e.g., measurements at the k-th type of landmark. The first partial derivative to the left of location (x,y) or $l_2$, the value of $\partial CD/\partial x$, can be approximated as:

$$\partial CD/\partial x \sim (CD(x,y) - CD(x-dx,y))/dx \quad \text{(Equation 10)}$$

Using a similar method we can approximate the second partial derivative $\partial^2 CD/\partial^2 x$ as:

$$\partial^2 CD/\partial^2 x \sim (CD(x+dx,y) - 2CD(x,y) + CD(x-dx,y))/dx/dx = \{(a_k CD_k(l_3) + b_k) - 2(a_i CD_i(l_2) + b_i) + (a_i CD_i(l_1) + b_i)\}/dx/dx \quad \text{(Equation 11)}$$

Equation 6 shows that each of the reconstructed critical dimension value depends linearly on the parameters $a_i$ and $b_i$. The sum of the squares of all the components in Equation 11 for every stitching point results in a square formula:

$$S(a_1, a_2, \ldots a_n, b_1, b_2, \ldots b_n) = \quad \text{(Function 12)}$$
$$S(p_1, p_2, \ldots p_{2n}) = \sum_{i,j=1}^{n} S_{ij} p_i p_j$$

Here, we introduce common notation for the optimization parameters $a_i$ and $b_i$:

$$p_{2i-1} = a_i, p_{2i} = b_i \quad \text{(Equation 13)}$$

Determination of the reconstructed global critical dimension can be formulated as an optimization problem. We have to find a set of the parameters $p_i$ that minimizes Function 12:

$$\{p_1, p_2, \ldots p_{2n}\}: \Rightarrow \min\left\{\sum_{i,j=1}^{n} S_{ij} p_i p_j\right\} \quad \text{(Formula 14)}$$

After the optimal set of the parameters p, are determined using Formula 14, the reconstructed critical dimension can be obtained using Equations 6 and 13.

The following describes an example of applying the landmark method on measurements performed on a wafer to verify the accuracy of the landmark method. The wafer has patterns transferred from a photo mask that has patterns for four dies. The patterns on the mask include dense lines and isolated lines. The critical dimensions of dense lines and the isolated lines are measured through several printing fields and then averaged. Thus, either the measurements on the dense lines or the measurements on the isolated lines can be used to show the global critical dimension uniformity.

To test the usefulness of the landmark method, we define a first group of measurements that measure the critical dimensions of the dense lines, and a second group of measurements that measure the critical dimensions of the isolated lines. The first group of measurements includes only measurements performed in the die area on the field, and the second group of measurements includes only measurements performed in the periphery area on the field. The global critical dimension behavior is reconstructed based on the first and second groups of measurements, and the reconstructed global critical dimension behavior is compared with the critical dimension behavior of the isolated lines that have been measured across the entire printing field.

FIG. 31 is a graph 470 showing the critical dimension distribution of isolated lines measured on the wafer. The critical dimensions range from about 127 nm to 131 nm.

FIG. 32 is a graph 480 showing the critical dimension distribution of dense lines measured on the wafer. The critical dimensions range from about 109 nm to 114 nm. FIGS. 31 and 32 show that the measured critical dimension distributions for dense and isolated lines have different ranges, but they both have the same trend. This shows that the dense lines and the isolated lines are affected by common factors.

Figure 33:
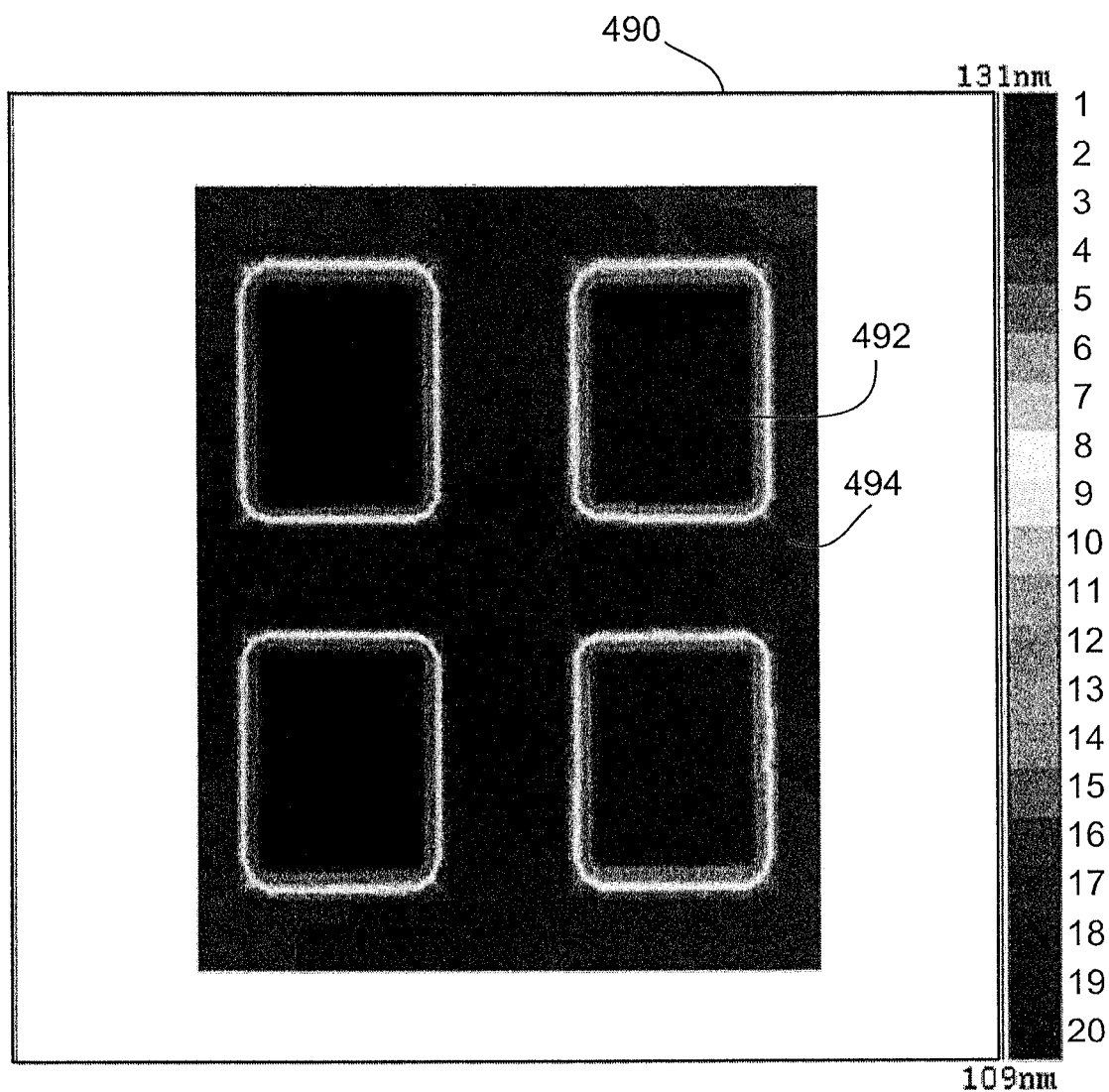
FIG. 33 is a graph showing example measurements of critical dimensions of dense lines and isolated lines.

FIG. 33 is a graph 490 showing the first group of measurements 492 that measure the critical dimensions of the dense lines, and a second group of measurements 494 that measure the critical dimensions of the isolated lines. This is similar to a situation where it is not possible to measure the full distribution for any type of the pattern, and that measurements of multiple types of patterns are needed to determine the full distribution of a global parameter.

Figure 34:
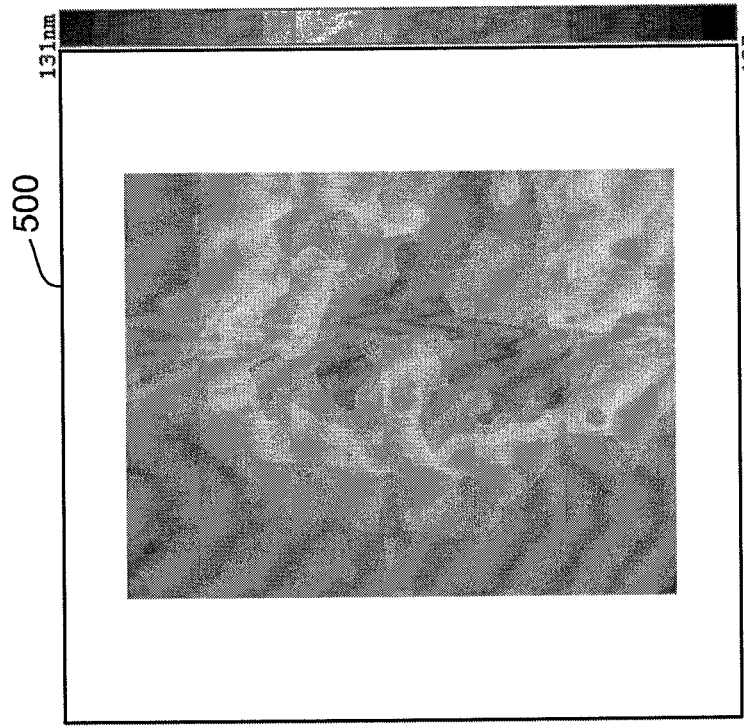
FIG. 34 is a graph showing example restored behavior of the critical dimension distribution of isolated lines.

FIG. 34 is a graph 500 showing the restored behavior of the critical dimension distribution of the isolated lines. The critical dimension values range from a minimum value of 127.9 nm to a maximum value of 130.5 nm, with a mean value of 129.3 nm and a deviation of 0.52 nm.

Figure 35:
FIG. 35 is a graph showing example measured behavior of the critical dimension distribution of isolated lines.

FIG. 35 is a graph 510 showing the measured behavior of the critical dimension distribution of the isolated lines. The critical dimension values range from a minimum value of 127.9 nm to a maximum value of 130.5 nm, with a mean value of 129.3 nm and a deviation of 0.6 nm. Comparing FIGS. 34 and 35, visually both distributions are almost identical. The difference between the critical dimension distribution in graphs 500 and 510 is much smaller than the critical dimension variation across the wafer.

Figure 36:
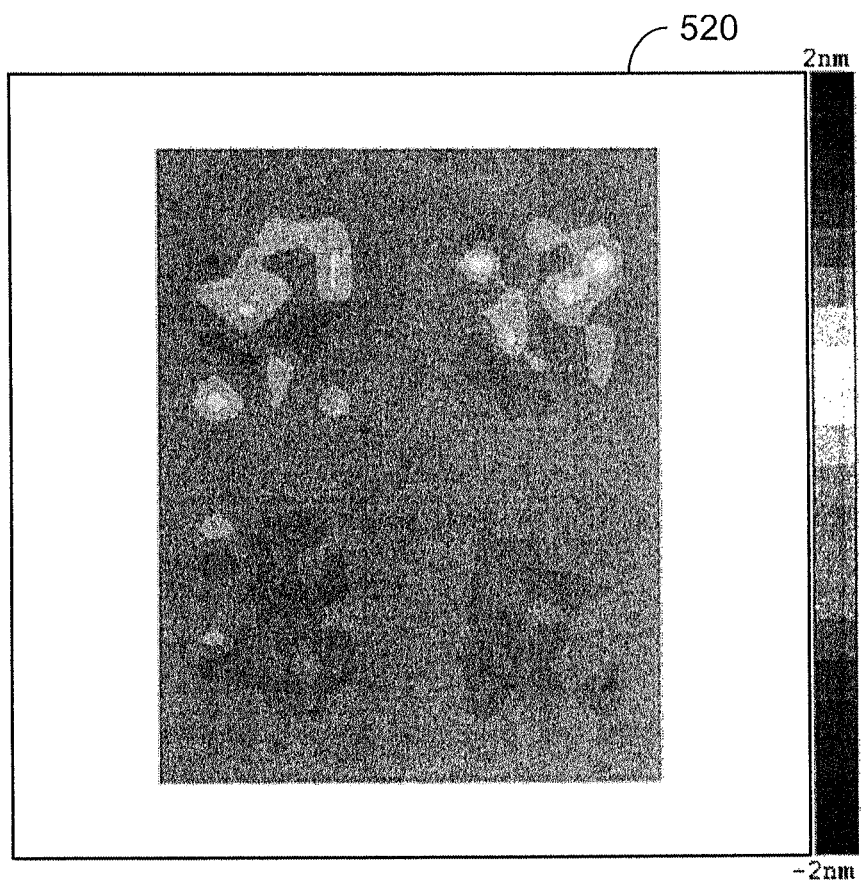
FIG. 36 is a graph showing the difference between the restored critical dimension distribution and the measured critical dimension distribution.

FIG. 36 is a graph 520 showing the difference between the restored critical dimension distribution of FIG. 34 and the measured critical dimension distribution of FIG. 35. As shown in FIG. 36, the difference is quite small, ranging from −0.52 nm to 0.66 nm, with a mean value of −0.014 nm and a deviation of 0.13 nm. FIG. 36 indicates that the reconstruction of the global critical dimension variation from the two groups of transmission measurements is good. The differences between the reconstructed and simulated critical dimension distributions are within the measurement noise level.

In the example above, the critical dimension information used to reconstruct in-die behavior can be acquired using various types of measurement technology, such as mask CD, AIMS aerial imaging CD, scatterometry-based CD, or CD estimated from mask transmittance measurements.

The features described above related to processing of data (for example, converting a transmission correction map or phase error map to a laser writing map) can be implemented in digital electronic circuitry, or in computer hardware, firmware, software, or in combinations of them. The features can be implemented in a computer program product tangibly embodied in an information carrier, e.g., in a machine-readable storage device, for execution by a programmable processor; and method steps can be performed by a programmable processor executing a program of instructions to perform functions of the described implementations by operating on input data and generating output. Alternatively or addition, the program instructions can be encoded on a propagated signal that is an artificially generated signal, e.g., a machine-generated electrical, optical, or electromagnetic signal, that is generated to encode information for transmission to suitable receiver apparatus for execution by a programmable processor.

The described features related to processing of data can be implemented advantageously in one or more computer programs that are executable on a programmable system including at least one programmable processor coupled to receive data and instructions from, and to transmit data and instructions to, a data storage system, an input device, and an output device. A computer program is a set of instructions that can be used, directly or indirectly, in a computer to perform a certain activity or bring about a certain result. A computer program can be written in any form of programming language (e.g., Fortran, C, C++, Objective-C, Java), including compiled or interpreted languages, and it can be deployed in any form, including as a stand-alone program or as a module, component, subroutine, or other unit suitable for use in a computing environment.

Suitable processors for the execution of a program of instructions include, by way of example, both general and special purpose microprocessors, and the sole processor or one of multiple processors or cores, of any kind of computer. Generally, a processor will receive instructions and data from a read-only memory or a random access memory or both. The essential elements of a computer are a processor for executing instructions and one or more memories for storing instructions and data. Generally, a computer will also include, or be operatively coupled to communicate with, one or more mass storage devices for storing data files; such devices include magnetic disks, such as internal hard disks and removable disks; magneto-optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM and DVD-ROM disks. The processor and the memory can be supplemented by, or incorporated in, ASICs (application-specific integrated circuits).

To provide for interaction with a user, the features can be implemented on a computer having a display device such as a CRT (cathode ray tube) or LCD (liquid crystal display) monitor for displaying information to the user and a keyboard and a pointing device such as a mouse or a trackball by which the user can provide input to the computer.

A number of implementations have been described. Nevertheless, it will be understood that various modifications may be made. For example, elements of one or more implementations may be combined, deleted, modified, or supplemented to form further implementations. As yet another example, the logic flows depicted in the figures do not require the particular order shown, or sequential order, to achieve desirable results. In addition, other steps may be provided, or steps may be eliminated, from the described flows, and other components may be added to, or removed from, the described systems.

The landmark method can be used to determine global parameters other than critical dimension uniformity. The variations of a global parameter can be constructed based on groups of indirect measurements of the global parameter at various landmarks, in which combining the groups of indirect measurements involves stitching the groups of the indirect measurements such that a combined measurement function has a minimum curvature. Some groups of indirection measurements are transformed prior to the stitching. Because all the groups of measurements are influenced by the same underlying common factor, the combined measurement function has a curvature that is not smaller than the curvature of a function representing the common factor. Optimizing coefficients of the transformations to achieve the minimum curvature for the combined measurement function means that we introduce as few additional variations or deviations as possible when sampling at the groups of landmarks with different response properties and stitching the measurements together. The landmark method is useful when, for example, the variations of the feature response properties are small and the spatial separations of the different landmarks are small.

The landmark method has many applications and can be used to measure many types of global parameters. For example, the landmark method can be used to obtain information for use in quality control in manufacturing processes, or gather information useful in making business decisions.

For example, suppose a company plans to distribute new products with several trim options at various price levels. The company would like to optimize the delivery of the products to different geographical regions by delivering more products to regions with higher demands. An assumption is made that consumer consumption or purchasing behavior depends on, among other factors, the local income level. Income levels may differ from one region of the country to another, and although the variances are not dramatic, for products at different price levels there will still be different levels of demands. Because data on the local income levels may not be readily available, the company may perform experiments by selling products, see how well the products sell, and use that information to determine future distributions of the products.

In conducting the experiment, if the company only sells a single product, it may take a long period of time to gather sufficient sales data because the number of consumers interested in buying the product may be small. Instead, the company can gather more sales data quickly by selling different types of products at various price levels that attract different segments of the consumer population. Using the sales data on all the different products, with the assumption that the variances of product consumption are driven by a common factor—income, the company can approximately reconstruct territorial distribution of the customer demand in a short amount of time.

For example, the company may conduct an experiment and sell products P1, P2, and P3 to geographical regions G1, G2, . . . , G10. Sales of product P1 may vary from one region to another. Similarly, sales of products P2 and P3 may also vary based on regions. By using the landmark method, sales data for all three products P1, P2, and P3 can be combined to determine which regions have higher purchasing powers. The company may then distribute a higher volume of the products to the regions with higher purchasing powers.

For example, the landmark method can be used to determine the critical dimension uniformity distribution on a wafer. The wafer critical dimension uniformity distribution can be determined based on a combination of various types of measurements. A first group of measurements can be based on critical dimension scanning electron microscopy (CD SEM). A second group of measurements can be based on scatterometry. A third group of measurements can be based on optical imaging (Wafer Level Critical Dimension Metrology, or WLCD). These three groups of measurements can be stitched together in a way to minimize the curvature of a combined measurement function, and the underlying global critical dimension variation can be derived using the methods described above. Performing CD SEM measurements may be expensive, so supplementing the CD SEM measurements with measurements based on scatterometry and transmission measurements allows the global critical dimension uniformity to be determined accurately at a lower cost.

In the examples shown in FIGS. 1 to 8, transmittance values are measured to derive the underlying critical dimension uniformity. The transmittance values have a linear dependence on the critical dimension variation, as shown in Equation 1, which includes parameters for biasing and scaling. More complex dependence of the measured values on the underlying common parameter can also be processed using the landmark method in a similar way by adding additional transformation parameters to the parameters of scaling and biasing. For example, the relationship between the measured parameter and variations in the underlying global parameter may be represented by a second order polynomial function.

In the examples above, an optical property (e.g., transmittance) of the photomask is measured at various locations of the photomask to determine the critical dimension variations across the photomask. Other properties can also be measured, such as an electrical property of a feature (e.g., critical feature) at each of various locations on the photomask. The electrical property can be, e.g., an electrical capacitance or an electrical resistance. The measured property can be, e.g., scattering of ultraviolet, deep ultraviolet, extreme ultraviolet light, or X-ray at various locations on the photomask. The measured property can be, e.g., transmittance or reflectance of a specific feature or a combination of specific features at each measurement location on the photomask.

In the example of FIG. 4, the transmittance values for two types of features are measured at various locations on the photomask. FIG. 6 shows the two groups of measurements being combined. Each data point in FIGS. 4 and 6 represents a transmittance measurement. In some implementations, each data point can be based on a combination of measurements. For example, both the transmittance and reflectance of a critical feature can be measured, and the transmittance and reflectance measurements can be combined into a single value representing a measured value associated with the critical feature. A first set of measured values for a first type of critical features are determined, and a second set of measured values for a second type of critical features are determined, in which each measured value is determined based on a transmittance value and a reflectance value. The first and second sets of measured values are combined in a way to minimize the curvature of the combined measurement function.

The measured value for each location can be determined based on any two or more properties described above, for example, an optical property of the substrate, transmittance of the substrate, reflectance of the substrate, transmittance of a specific feature, reflectance of a specific feature, transmittance of a combination of specific features, reflectance of a combination of specific features, scattering of ultraviolet light, scattering of deep ultraviolet, scattering of extreme ultraviolet light, scattering of X-ray, an electrical property of the substrate, an electric capacitance of a specific feature, an electric resistance of a specific feature, or an aerial imaging critical dimension of a specific feature.

In the examples above, linear dependence of parameters on the global factor is used because it is a good approximation in case of small variations of the global factor. If the exact type of dependence is known, that knowledge may be used to improve resulting reconstruction. For example, the transmittance of light through circular or rectangular holes is quadratic versus the linear dimension of the hole when its size is much greater than the wavelength. When the linear dimension of the hole is of the order of the wavelength, the transmission depends on light polarization. For any specific polarization, the transmission still has quadratic dependence with respect to the hole dimension. For smaller hole sizes, interactions with the absorber and the substrate material play a significant role and the transmission may have non-quadratic dependence with respect to the hole dimension. The transmission of light through holes is described in, for example, "Transmission of Light through a Single Rectangular Hole" by F. J. Garcia-Vidal et al., Physical Review Letters, PRL 95, 103901 (2005), pages 103901-1 to 103901-4, and "Resonance Transmittance Through a Metal Film With Subwavelength Holes" by Andrey K. Sarychev et al., IEEE Journal of Quantum Electronics, Vol. 38, No. 7, July 2002, pages 956-963. Also, with higher levels of critical dimension variations, second or higher order approximation may be useful.

The computer 106 can be a programmable microcontroller. Additional components may be included in the system 100. Accordingly, other implementations are within the scope of the following claims.

What is claimed is:

1. A method for processing data associated with a substrate, comprising:
   performing measurements on a plurality of groups of targets on a substrate, the plurality of groups of targets comprising a first type of targets and a second type of targets, the first type of targets being measured at a first group of locations on the substrate to generate a first group of measurement values, the second type of targets being measured at a second group of locations on the substrate to generate a second group of measurement values, the plurality of groups of measurement values being influenced by variations in a global parameter that is a function of location on the substrate;
   defining a combined measurement function representing a combination of the plurality of groups of measurement values taking into account of the locations of the measurements, at least one group of measurement values being transformed prior to combining with another group or other groups of measurement values, the transformations being defined by a set of coefficients;
   determining, using a computer, values for the coefficients of the transformation; and
   determining, using the computer, variations in the global parameter based on the combined measurement function and a predetermined relationship between the measurement values and the global parameter.

2. The method of claim 1 in which the global parameter comprises critical dimension across the substrate.

3. The method of claim 1 in which the predetermined relationship between the measurement values and the global parameter comprises a linear relationship between variations in the measurement values and variations in the global parameter.

4. The method of claim 1, comprising modifying the substrate at various locations to reduce the variation in the global parameter.

5. The method of claim 1 in which determining values for the coefficients comprises selecting the coefficient values of the transformation to enhance a smoothness of curvature of the combined measurement function.

6. The method of claim 5, comprising identifying boundaries between different groups of targets.

7. The method of claim 6, comprising for each boundary, determining a second derivative of the combined measurement function.

8. The method of claim 1 in which determining values for the coefficients comprises selecting the coefficient values to reduce overall steps of the combined measurement function at boundaries between measurement values associated with different groups of targets.

9. The method of claim 1 in which performing the measurements on the first type of targets comprises measuring transmission of the substrate at the first group of locations with respect to a radiation, and performing the measurements on the second type of targets comprise measuring transmission of the substrate at the second group of locations.

10. The method of claim 1 in which the first type of targets comprise a first type of critical features, and the second type of targets comprise a second type of critical features.

11. The method of claim 1 in which the global parameter has one dimension, and the measurements are performed in a one-dimensional space.

12. The method of claim 1 in which the global parameter has two dimensions, and the measurements are performed in a two-dimensional space.

\* \* \* \* \*